(12) United States Patent
Miyasaka et al.

(10) Patent No.: US 11,983,795 B2
(45) Date of Patent: May 14, 2024

(54) ELECTRO-OPTICAL DEVICE AND ELECTRONIC APPARATUS

(71) Applicant: SEIKO EPSON CORPORATION, Tokyo (JP)

(72) Inventors: Mitsutoshi Miyasaka, Suwa (JP); Yoichi Momose, Matsumoto (JP); Kiyoshi Sekijima, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/752,081

(22) Filed: May 24, 2022

(65) Prior Publication Data

US 2022/0284540 A1 Sep. 8, 2022

Related U.S. Application Data

(63) Continuation of application No. 17/160,931, filed on Jan. 28, 2021, now Pat. No. 11,367,162, which is a
(Continued)

(30) Foreign Application Priority Data

Feb. 20, 2018 (JP) .................................. 2018-027635
Jan. 15, 2019 (JP) .................................. 2019-004135

(51) Int. Cl.
*G06F 13/00* (2006.01)
*G02B 27/01* (2006.01)
(Continued)

(52) U.S. Cl.
CPC .............. *G06T 1/60* (2013.01); *G02B 27/017* (2013.01); *H10K 59/131* (2023.02);
(Continued)

(58) Field of Classification Search
CPC .......... G09G 5/39; G09G 5/393; G09G 5/399; G09G 5/14; G06T 1/60
(Continued)

(56) References Cited

U.S. PATENT DOCUMENTS 6,175,349 B1 * 1/2001 Kokuhata ............ G09G 3/3696
345/95
6,765,549 B1 7/2004 Yamazaki et al.
(Continued)

FOREIGN PATENT DOCUMENTS

CN 1728896 A 2/2006
CN 104751777 A 7/2015
(Continued)

OTHER PUBLICATIONS

Apr. 8, 2020 Office Action issued in U.S. Appl. No. 16/279,559.
(Continued)

*Primary Examiner* — Gordon G Liu
(74) *Attorney, Agent, or Firm* — Oliff PLC

(57) ABSTRACT

An electro-optical device includes a pixel circuit 41G, a pixel circuit 41B, a high potential line 47G configured to supply a high potential VDDG to the pixel circuit 41G, a high potential line 47B configured to supply a high potential VDDB to the pixel circuit 41B, and a low potential line 46 configured to supply a first low potential VSS1 to the pixel circuit 41G and the pixel circuit 41B. The pixel circuit 41G includes a light-emitting element 20G configured to display G, the pixel circuit 41B includes a light-emitting element 20B configured to display B, and the high potential VDDG and the high potential VDDB are mutually independent.

12 Claims, 15 Drawing Sheets

Related U.S. Application Data continuation of application No. 16/279,559, filed on Feb. 19, 2019, now Pat. No. 10,943,326.

(51) Int. Cl.
*G06T 1/60* (2006.01)
*H10K 59/131* (2023.01)
*H10K 59/35* (2023.01)
*H10K 59/38* (2023.01)

(52) U.S. Cl.
CPC .............. *G02B 2027/0112* (2013.01); *G02B 2027/0118* (2013.01); *G02B 2027/0123* (2013.01); *G02B 2027/014* (2013.01); *G02B 27/0172* (2013.01); *G02B 2027/0178* (2013.01); *H10K 59/35* (2023.02); *H10K 59/38* (2023.02)

(58) Field of Classification Search
USPC ........................................................ 345/536
See application file for complete search history.

(56) References Cited

U.S. PATENT DOCUMENTS

| | | | |
|---|---|---|---|
| 2002/0018060 A1 | 2/2002 | Yamazaki et al. | |
| 2002/0036625 A1 | 3/2002 | Nakamura | |
| 2002/0070913 A1 | 6/2002 | Kimura et al. | |
| 2002/0075211 A1 | 6/2002 | Nakamura | |
| 2002/0140642 A1 | 10/2002 | Okamoto | |
| 2003/0146888 A1* | 8/2003 | Yamazaki | G09G 3/3291 345/82 |
| 2004/0196235 A1 | 10/2004 | Koyama et al. | |
| 2004/0257358 A1 | 12/2004 | Okamoto | |
| 2005/0093802 A1 | 5/2005 | Yamazaki et al. | |
| 2006/0274090 A1 | 12/2006 | Koyama et al. | |
| 2007/0159417 A1 | 7/2007 | Miyake | |
| 2008/0150424 A1 | 6/2008 | Okamoto | |
| 2009/0102749 A1 | 4/2009 | Kawabe | |
| 2010/0073269 A1 | 3/2010 | Yamazaki et al. | |
| 2011/0298694 A1 | 12/2011 | Nieh | |
| 2013/0229117 A1 | 9/2013 | Yamazaki et al. | |
| 2013/0307421 A1 | 11/2013 | Tanada | |
| 2014/0184628 A1* | 7/2014 | Lee | G09G 5/14 345/545 |
| 2014/0354698 A1 | 12/2014 | Lee et al. | |
| 2016/0358547 A1 | 12/2016 | Zhu et al. | |
| 2017/0287401 A1* | 10/2017 | Matsui | G09G 3/3233 |
| 2018/0322831 A1 | 11/2018 | Kim et al. | |
| 2019/0019452 A1 | 1/2019 | Zhu et al. | |

FOREIGN PATENT DOCUMENTS

| | | |
|---|---|---|
| JP | 2002-140036 A | 5/2002 |
| JP | 2002-151276 A | 5/2002 |
| JP | 2002-156954 A | 5/2002 |
| JP | 2002-287695 A | 10/2002 |
| JP | 2003-280587 A | 10/2003 |
| JP | 2004-62199 A | 2/2004 |
| JP | 2004-111194 A | 4/2004 |
| JP | 2004-163601 A | 6/2004 |
| JP | 2004-530160 A | 9/2004 |
| JP | 2004-309669 A | 11/2004 |
| JP | 2005-032704 A | 2/2005 |
| JP | 2005-536778 A | 12/2005 |
| JP | 2006-309182 A | 11/2006 |
| JP | 2007-206681 A | 8/2007 |
| JP | 2009-098471 A | 5/2009 |
| JP | 2014-232314 A | 12/2014 |
| WO | 02/093540 A1 | 11/2002 |
| WO | 2004/021327 A1 | 3/2004 |
| WO | 2009/078220 A1 | 6/2009 |

OTHER PUBLICATIONS

Jul. 29, 2020 Office Action issued in U.S. Appl. No. 16/279,559.
Nov. 3, 30, 2020 Notice of Allowance issued in U.S. Appl. No. 16/279,559.

* cited by examiner

ELECTRO-OPTICAL DEVICE AND ELECTRONIC APPARATUS

CROSS-REFERENCE TO RELATED APPLICATION(S)

This application is a continuation of U.S. application Ser. No. 17/160,931 filed Jan. 28, 2021, which is a continuation of U.S. application Ser. No. 16/279,559 filed Feb. 19, 2019, which is based on and claims priority under 35 U.S.C. 119 from Japanese Patent Application No. 2019-004135 filed on Jan. 15, 2019 and Japanese Patent Application No. 2018-027635 filed on Feb. 20, 2018. The contents of the above applications are incorporated herein by reference.

BACKGROUND

1. Technical Field

The present invention relates to an electro-optical device and an electronic apparatus.

2. Related Art

In recent years, as an electronic apparatus that enables formation and viewing of a virtual image, a head-mounted display (HMD) of a type that directs image light from an electro-optical device to a pupil of an observer, has been proposed. One example of the electro-optic device used in these electronic apparatuses is an organic electro-luminescence (EL) device that includes an organic EL element as a light-emitting element. The organic EL device used in the head-mounted display has been required to provide higher resolution (fine pixels), multiple gray scales of display, and lower power consumption.

In the typical organic EL device, when a selection transistor turns to an ON-state by a scan signal supplied to a scan line, an electrical potential based on an image signal supplied from a data line is maintained in a capacitive element electrically connected to a gate of a drive transistor. When the drive transistor turns to an ON-state in response to the electrical potential maintained in the capacitive element, that is, a gate potential of the drive transistor, an electric current flows through the organic EL element depending on the gate potential of the drive transistor and the organic EL element emits light with a luminance depending on the electric current.

In this way, according to the typical organic EL device, since a gray-scale display is performed by analog driving that controls the current flowing through the organic EL element depending on the gate potential of the drive transistor, there is a problem that a variation in luminance and a deviation in gray scale occur between pixels and a display quality decreases due to a variation in current-voltage characteristics and a threshold voltage of the drive transistor. On the other hand, an organic EL device (memory integrated display element) has been proposed that includes a memory circuit in which an inverter including a P-type transistor and an N-type transistor is electrically connected in a circle in each pixel, and performs display by digital driving (for example, see JP-A-2002-287695).

According to the configuration of the organic EL device described in JP-A-2002-287695, either High (a reference potential Vh), in which the light-emitting element emits light, or Low (a ground potential Vg), in which the light-emitting element does not emit light, is applied to the anode of the light-emitting element. That is, a voltage applied to the light-emitting element is either one of binary values, Vh−Vg at the time of emission and Vg−Vg=0 at the time of non-emission. Further, the gray-scale display is performed by adjusting the light emission time within one field, that is, a combination of a sub-field in which High is applied to the anode of the light-emitting element in an emission state and a sub-field in which Low is applied to the anode of the light-emitting element in a non-emission state.

However, in a case where a color display is performed by combining light-emitting elements using organic EL materials (light-emitting materials) that emit light of each color of RGB, there is a problem that because the emission luminance characteristics with respect to the voltage differed between the light-emitting materials corresponding to different colors, adjusting the display color may become difficult. Further, there is a problem that the initially adjusted color balance may change with time due to the fact that the deterioration speed differs depending on each light-emitting material.

SUMMARY

An electro-optical device according to an aspect of the present application includes a first pixel circuit, a second pixel circuit, a first wiring line supplying a first potential to the first pixel circuit, a second wiring line supplying a second potential to the second pixel circuit, and a third wiring line supplying a third potential to the first pixel circuit and the second pixel circuit. The first circuit corresponding to a first color includes a first light-emitting element, the second pixel circuit corresponding to a second color that differs from the first color includes a second light-emitting element, and the first potential and the second potential are mutually independent.

In the electro-optical device described above, it is preferable that the first potential is different from the second potential.

In the electro-optical device described above, it is preferable that a terminal of the first light-emitting element is electrically connected to the first wiring line, and that a terminal of the second light-emitting element is electrically connected to the second wiring line.

In the electro-optical device described above, it is preferable that the first pixel circuit includes a first memory circuit, the second pixel circuit includes a second memory circuit, the first memory circuit is arranged between the first wiring and the third wiring, and the second memory circuit is arranged between the second wiring and the third wiring.

In the electro-optical device described above, it is preferable that the first memory circuit and the second memory circuit are configured to store a digital signal, that Low of the digital signal is lower than a center potential of the first potential and the third potential, and that High of the digital signal is higher than a center potential of the second potential and the third potential.

In the electro-optical device described above, it is preferable that the first pixel circuit includes a first transistor that is electrically connected in series to the first light-emitting element, that the second pixel circuit includes a second transistor that is electrically connected in series to the second light-emitting element, and that the third potential is lower than the first potential and the second potential.

In the electro-optical device described above, it is preferable that the first potential is lower than the second potential.

In the electro-optical device described above, it is preferable that the first memory circuit and the second memory circuit are configured to store a digital signal, that High of the digital signal is higher than a center potential of the first potential and the third potential, and that Low of the digital signal is lower than a center potential of the second potential and the third potential.

In the electro-optical device described above, it is preferable that the first pixel circuit includes a first transistor that is electrically connected in series to the first light-emitting element, that the second pixel circuit includes a second transistor that is electrically connected in series to the second light-emitting element, and that the third potential is higher than the first potential and the second potential.

In the electro-optical device described above, it is preferable that the first potential is higher than the second potential.

In the electro-optical device described above, it is preferable that the first pixel circuit and the second pixel circuit are arranged along a first direction, and that the first wiring and the second wiring extend along the first direction.

In the electro-optical device described above, it is preferable that the first wiring and the second wiring are arranged in a display region in which the first pixel circuit and the second pixel circuit are arranged and at an outside of the display region, and that, in the display region, a thickness of the first wiring is different from a thickness of the second wiring.

In the electro-optical device described above, it is preferable that the first wiring, the second wiring and the third wiring are arranged in a display region in which the first pixel circuit and the second pixel circuit are arranged and at an outside of the display region, and that, at the outside of the display region, at least a part of the first wiring and at least a part of the second wiring are thinner than the third wiring.

In the electro-optical device described above, it is preferable that the electro-optical device further includes a fourth wiring configured to supply a fourth potential to the first pixel circuit and the second pixel circuit, the third potential and the fourth potential being mutually independent.

In the electro-optical device described above, it is preferable that the third potential is different from the fourth potential.

In the electro-optical device described above, it is preferable that another terminal of the first light-emitting element is electrically connected to the fourth wiring, and that another terminal of the second light-emitting element is electrically connected to the fourth wiring.

In the electro-optical device described above, it is preferable that the first wiring, the second wiring, and the fourth wiring are arranged in a display region in which the first pixel circuit and the second pixel circuit are arranged and at an outside of the display region, and that, at the outside of the display region, at least a part of the first wiring and at least a part of the second wiring are thinner than the fourth wiring.

An electronic apparatus according to an aspect of the present application includes the electro-optical device described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
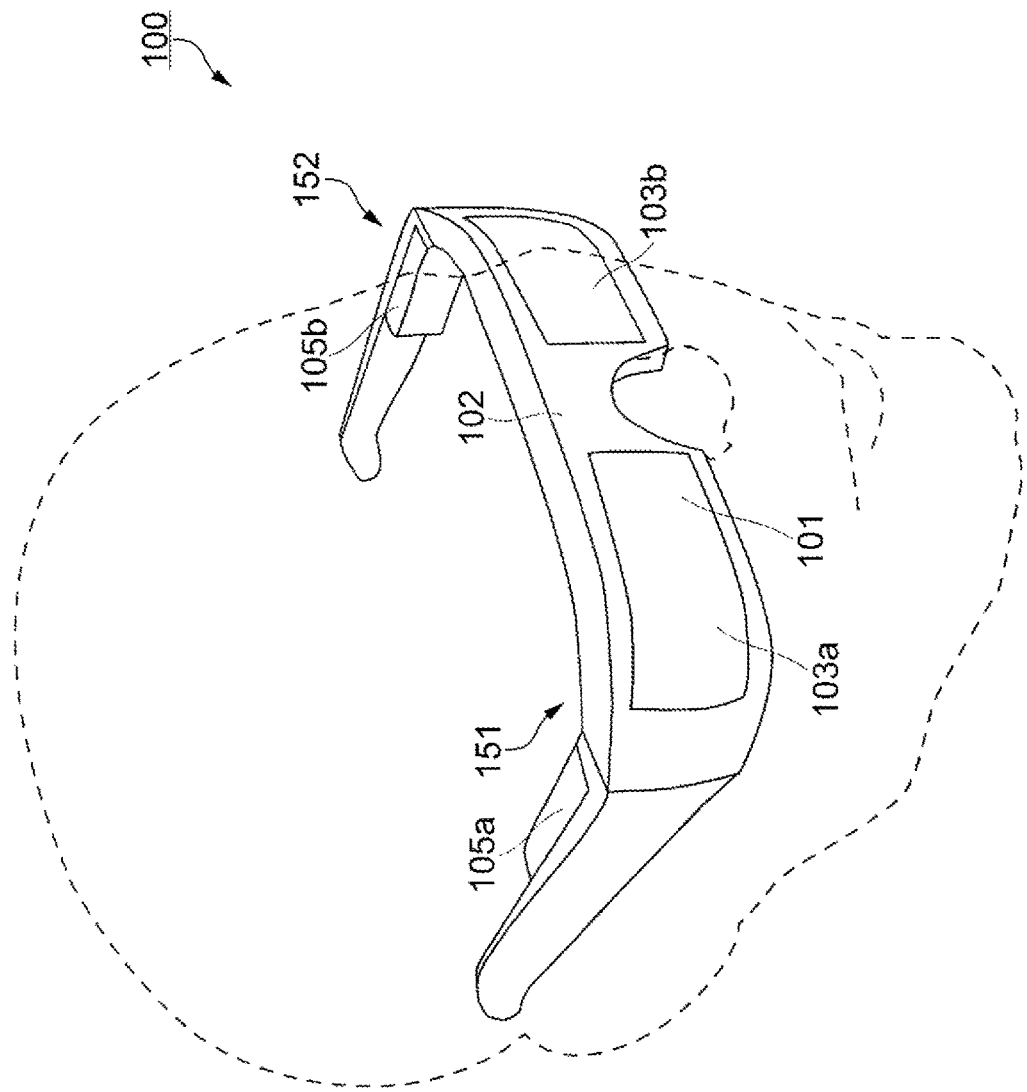
FIG. 1 illustrates a diagram for describing an outline of an electronic apparatus according to the present exemplary embodiment.

Hereinafter, exemplary embodiments of the present invention will be described with reference to drawings. Note that in the drawings referred to below, each layer and each member, and the like is not to scale in order to make each layer, and each member, and the like recognizable in size.

Outline of Electronic Apparatus

Outline of an electronic apparatus will now be described with reference to FIG. 1. FIG. 1 illustrates a diagram for describing the outline of the electronic apparatus according to the present exemplary embodiment.

Figure 3:
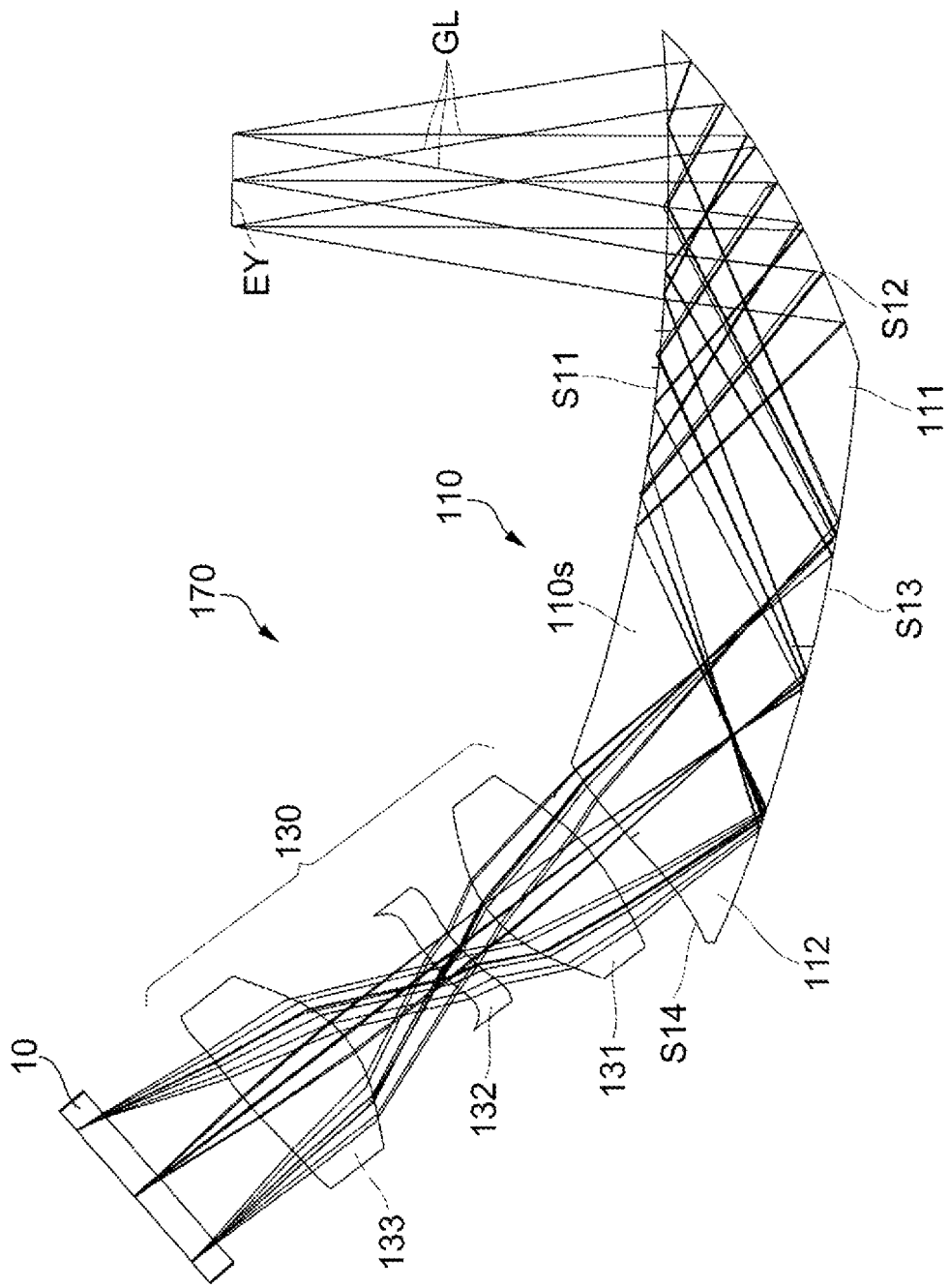
FIG. 3 illustrates a diagram for describing an optical system of the electronic apparatus according to the present exemplary embodiment.

A head-mounted display 100 is one example of the electronic apparatus according to the present exemplary embodiment, and includes an electro-optical device 10 (see FIG. 3). As illustrated in FIG. 1, the head-mounted display 100 has an appearance like glasses. With respect to a user who wears the head-mounted display 100, an image light GL (see FIG. 3) serving as an image is visually recognized, and external light is visually recognized by the user through see-through. In short, the head-mounted display 100 has a see-through function that displays a superimposition of the external light and the image light GL, has a wide angle of view and high performance, and is also small and light.

The head-mounted display 100 includes a see-through member 101 that covers a front of eyes of the user, a frame 102 that supports the see-through member 101, and a first built-in device unit 105a and a second built-in device unit 105b attached to portions of the frame 102 extending from cover portions at both left and right ends of the frame 102 over rear sidepieces (temples).

The see-through member 101 is a thick, curved optical member (transparent eye cover) that covers the front of eyes of the user and is separated into a first optical portion 103a and a second optical portion 103b. As seen on the left side in FIG. 1, a first display apparatus 151, which includes a combination of the first optical portion 103a and the first built-in device unit 105a, is a part to display a virtual image for a right eye through see-through and functions by itself as an electronic apparatus with a display function. As seen on the right side in FIG. 1, a second display apparatus 152, which includes a combination of the second optical portion 103b and the second built-in device unit 105b, is a part to display a virtual image for a left eye through see-through and functions by itself as an electronic apparatus with a display function. The electro-optical device 10 (see FIG. 3) is incorporated in the first display apparatus 151 and the second display apparatus 152.

Internal Structure of Electronic Apparatus

Figure 2:
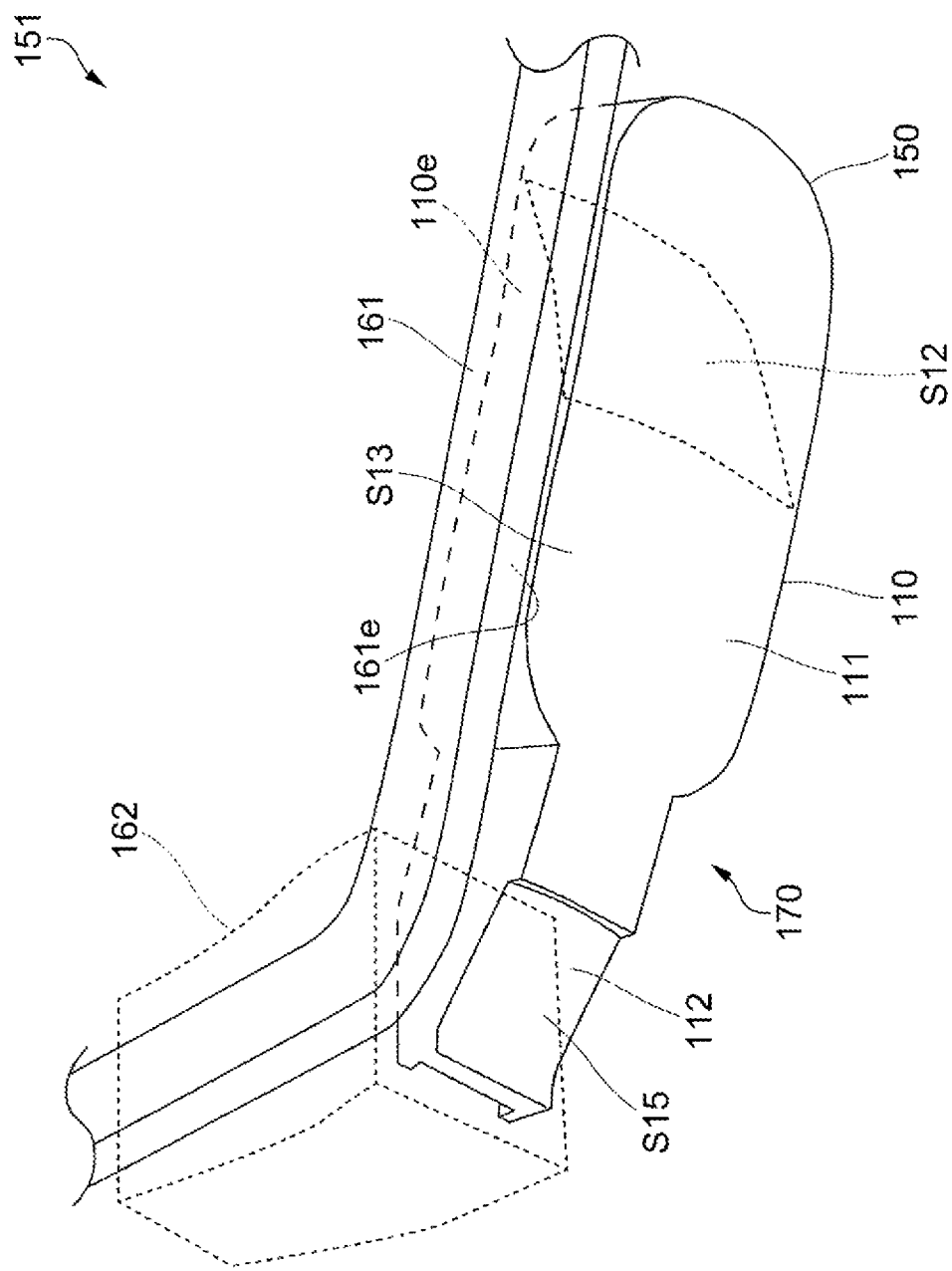
FIG. 2 illustrates a diagram for describing an internal structure of the electronic apparatus according to the present exemplary embodiment.

FIG. 2 illustrates a diagram for describing the internal structure of the electronic apparatus according to the present exemplary embodiment. FIG. 3 illustrates a diagram for describing an optical system of the electronic apparatus according to the present exemplary embodiment. The internal structure and the optical system of the electronic apparatus will now be described with reference to FIG. 2 and FIG. 3. Note that, while FIG. 2 and FIG. 3 illustrate the first display apparatus 151 as an example of the electronic apparatus, the second display apparatus 152 is symmetrical to the first display apparatus 151 and has substantially the same structure. Accordingly, only the first display apparatus 151 will be described here and detailed description of the second display apparatus 152 will be omitted.

As illustrated in FIG. 2, the first display apparatus 151 includes a projection see-through device 170 and the electro-optical device 10 (see FIG. 3). The projection see-through device 170 includes a prism 110 serving as a light-guiding member, a transparent member 150, and a projection lens 130 for image formation (see FIG. 3). The prism 110 and the transparent member 150 are integrated together by bonding and are firmly fixed to the bottom of a frame 161 such that a top face 110e of the prism 110 and a bottom face 161e of the frame 161 are held in contact with each other, for example.

The projection lens 130 is fixed to an end of the prism 110 through a lens barrel 162 that houses the projection lens 130. The prism 110 and the transparent member 150 in the projection see-through device 170 correspond to the first optical portion 103a illustrated in FIG. 1. The projection lens 130 and the electro-optical device 10 in the projection see-through device 170 correspond to the first built-in device unit 105a illustrated in FIG. 1.

The prism 110 in the projection see-through device 170 is an arc-shaped member that is curved so as to follow the face in a plan view and can be considered to be separated into a first prism portion 111 on the central side closer to the nose and a second prism portion 112 on the peripheral side away from the nose. The first prism portion 111 is arranged on a light emission side and includes a first surface S11 (see FIG. 3), a second surface S12, and a third surface S13 as side surfaces having an optical function.

The second prism portion 112 is arranged on a light incident side and includes a fourth surface S14 (see FIG. 3) and a fifth surface S15 as side surfaces having an optical function. Of these faces, the first face S11 and the fourth face S14 are adjacent, the third face S13 and the fifth face S15 are adjacent, and the second face S12 is arranged between the first face S11 and the third face S13. Also, the prism 110 has the top face 110e that is adjacent to the fourth face S14 from the first face S11.

The prism 110 is formed from a resin material with high optical transparency in a visible range and is molded, for example, by pouring a thermoplastic resin into a mold and curing the resin. While a main portion 110s (see FIG. 3) of the prism 100 is illustrated as an integrally formed member, it can be considered to be separated into the first prism portion 111 and the second prism portion 112. The first prism portion 111 can guide and output the image light GL and also allows external light to be seen-through. The second prism portion 112 can receive and guide the image light GL.

The transparent member 150 is integrally fixed to the prism 110. The transparent member 150 is a member (auxiliary prism) that assists a see-through function of the prism 110. The transparent member 150 exhibits high optical transparency in a visible range and is formed from a resin material with a refractive index that is substantially equal to the refractive index of the body portion 110s of the prism 110. The transparent member 150 is formed, for example, by molding thermoplastics resin.

As illustrated in FIG. 3, the projection lens 130 includes three lenses 131, 132, and 133 along the optical axis on the light input side. Each of the lenses 131, 132, and 133 is rotationally symmetrical with respect to the central axis of the light input surfaces of the lenses, and at least one of the lenses 131, 132, and 133 is an aspherical lens.

The projection lens 130 directs the image light GL emitted from the electro-optical device 10 into the prism 110 to re-form an image on an eye EY. In other words, the projection lens 130 is a relay optical system to re-form an image of the image light GL emitted from each pixel of the electro-optical device 10 on the eye EY through the prism 110. The projection lens 130 is held in the lens barrel 162 and the electro-optical device 10 is fixed to an end of the lens barrel 162. The second prism portion 112 of the prism 110 is coupled to the lens barrel 162 which holds the projection lens 130, to indirectly support the projection lens 130 and the electro-optical device 10.

An electronic apparatus of a type that is mounted on the head of the user to cover the front of the eyes, such as the head-mounted display 100, is required to be small and light. Further, the electro-optical device 10 used in an electronic apparatus such as the head-mounted display 100 is required to provide higher resolution (finer pixels), multiple gray scales of display, and lower power consumption.

Configuration of Electro-Optical Device

Figure 4:
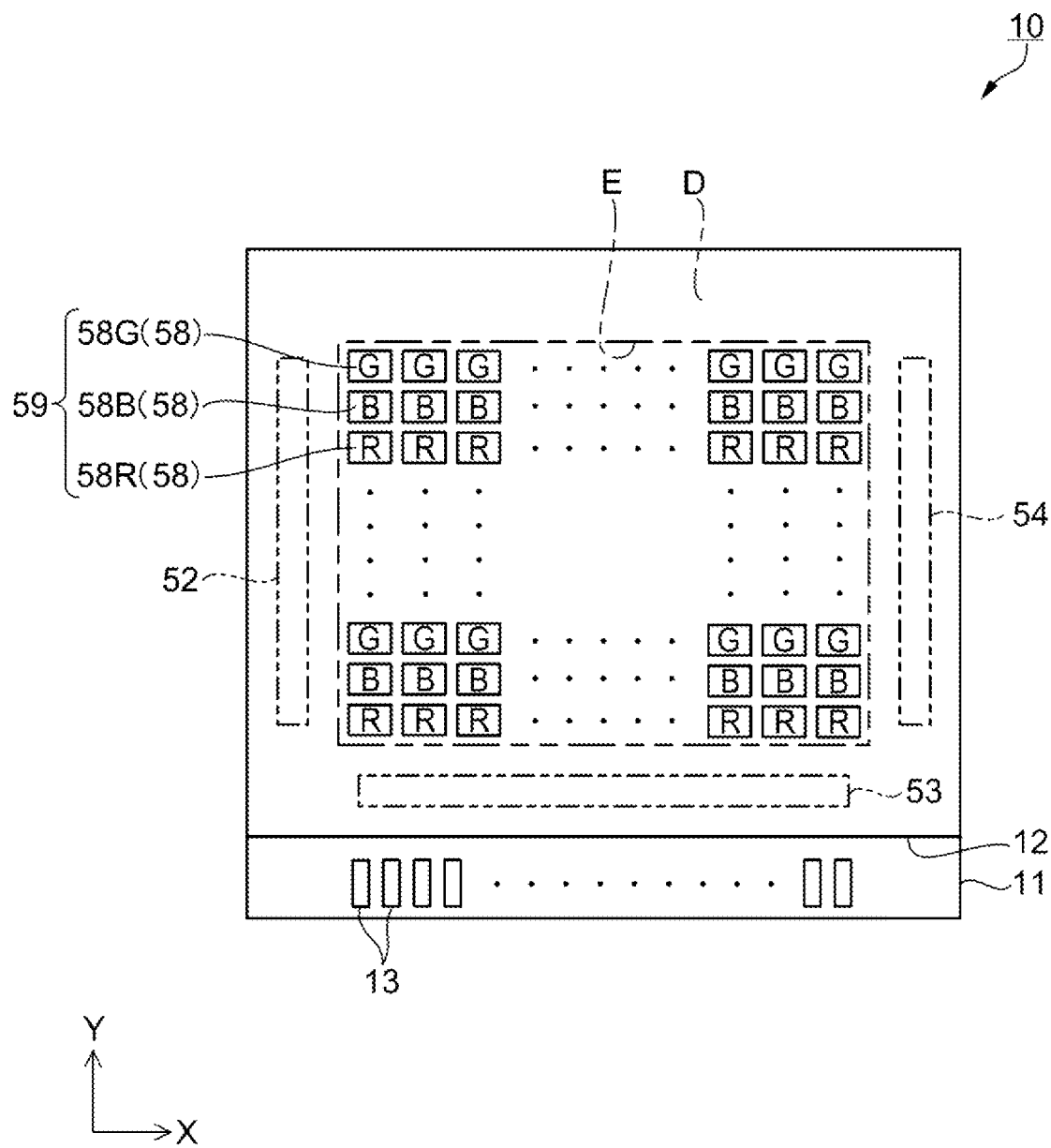
FIG. 4 illustrates a schematic plan view illustrating a configuration of an electro-optical device according to the present exemplary embodiment.

Next, a configuration of the electro-optical device will now be described with reference to FIG. 4. FIG. 4 illustrates a schematic plan view illustrating the configuration of the electro-optical device according to the present exemplary embodiment. The present exemplary embodiment will be described by taking, as an example, a case where the electro-optical device 10 is an organic EL device including an organic EL element as a light-emitting element. As illustrated in FIG. 4, the electro-optical device 10 according to the present exemplary embodiment includes an element substrate 11 and a protective substrate 12. The element substrate 11 and the protective substrate 12 are arranged to face each other and are bonded together with a filler (not illustrated).

The element substrate 11 is formed of, for example, a single-crystal semiconductor substrate (for example, a single-crystal silicon wafer). The element substrate 11 includes a display region E and a non-display region D surrounding the display region E. In the display region E, for example, sub-pixels 58G that emit green light (G) as a first color, sub-pixels 58B that emit blue light (B) as a second color, and sub-pixels 58R that emit red light (R) as a third color are arranged in a matrix, for example.

Figure 7:
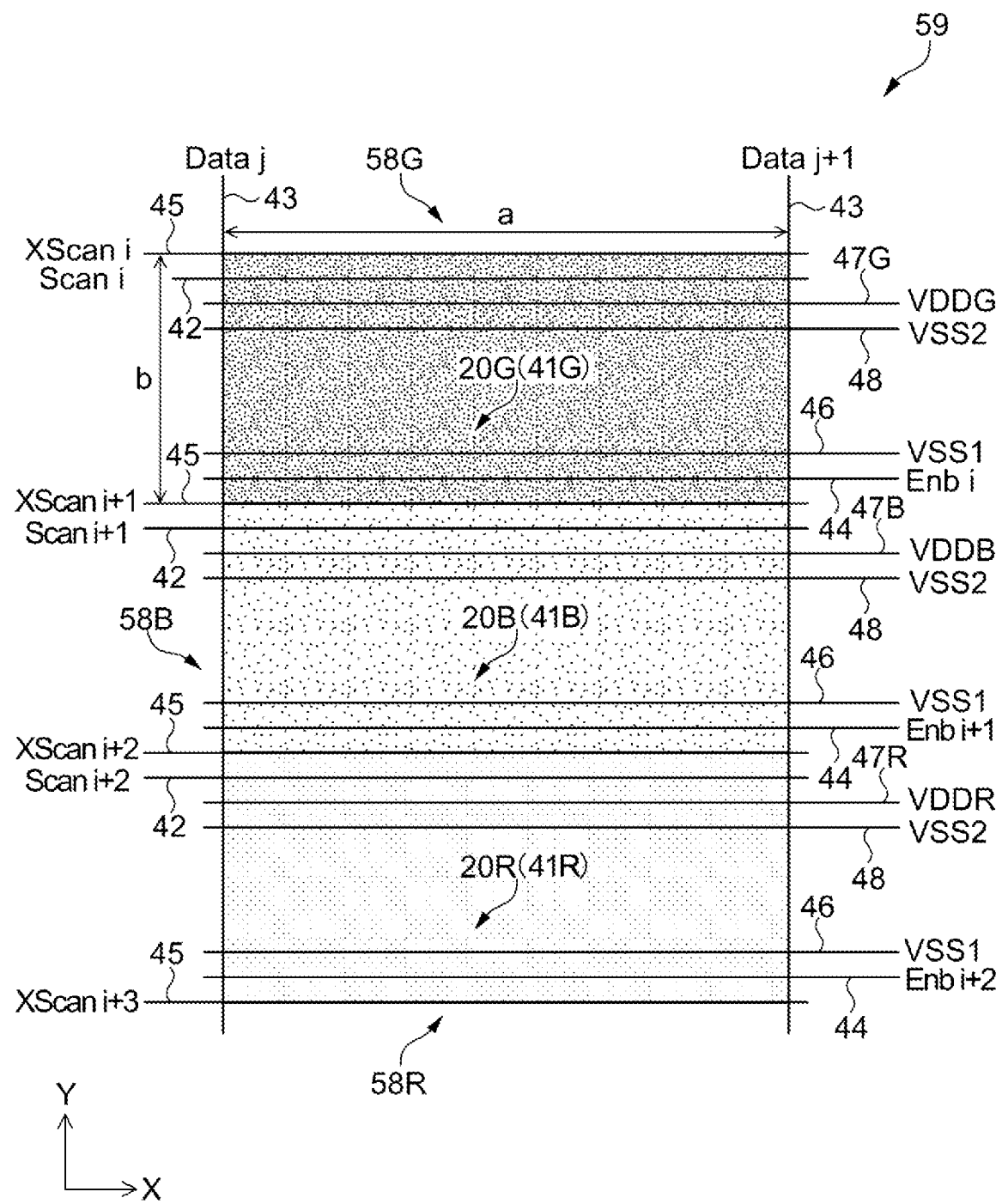
FIG. 7 illustrates a diagram for describing a configuration of a pixel according to the present exemplary embodiment.

The sub-pixel 58G, the sub-pixel 58B, and the sub-pixel 58R are each provided with a light-emitting element 20G, a light-emitting element 20B, and a light-emitting element 20R (see FIG. 7). The light-emitting element 20G, the light-emitting element 20B, and the light-emitting element 20R emit lights of different colors corresponding to G, B, and R respectively. In the electro-optical device 10, a pixel 59 including the sub-pixel 58G, the sub-pixel 58B, and the sub-pixel 58R serves as a unit of display, and a full-color display is provided.

Note that in the present specification, the sub-pixel 58G, the sub-pixel 58B, and the sub-pixel 58R may be collectively referred to as a sub-pixel 58 without distinction. The display region E is a region where light is emitted from the sub-pixel 58 and contributes to display. The non-display region D outside the display region E is an area where no light is emitted from the sub-pixel 58 and does not contribute to display.

The element substrate 11 is larger than the protective substrate 12 and a plurality of external coupling terminals 13 are arranged along a first side of the element substrate 11 which extends out of the protective substrate 12. A data line drive circuit 53 is provided between the display region E and the plurality of external coupling terminals 13. A scan line drive circuit 52 is provided between the display region E and a second side that is another side perpendicular to the first side. An enable line drive circuit 54 is provided between the display region E and a third side that is perpendicular to the first side and opposite to the second side.

The protective substrate 12 is smaller than the element substrate 11 and is arranged so that the external coupling terminals 13 are exposed. The protective substrate 12 is a substrate with optical transparency, for example, such as a quartz substrate or a glass substrate, for example. The protective substrate 12 serves to protect the light-emitting element 20 arranged in the sub-pixel 58 in the display region E from damage and is arranged to face at least the display region E. Note that, the protective substrate 12 is not essential, and a protective layer that protects the light-emitting element 20 may be provided on the element substrate 11 instead of the protective substrate 12.

In the present specification, the direction along the first side where the external coupling terminals 13 are arranged is defined as the X direction (row direction) as the first direction, and the direction (column direction) along two other sides (the second side and the third side) which are perpendicular to the first side and opposed to each other is defined as a Y direction. In the present exemplary embodiment, a so-called horizontal stripe arrangement is adopted, for example, in which the sub-pixels 58 that emit the same color are arranged in the row direction (X direction), and the sub-pixels 58 that emit different colors are arranged in the column direction (Y direction).

Note that, the arrangement of the sub-pixels 58 in the column direction (Y direction) is not limited to the order of G, B, and R as illustrated in FIG. 4, and may be, for example, in the order of B, G, and R or in the order of R, G, and B. Further, the arrangement of the sub-pixels 58 is not limited to the stripe arrangement and may be a delta arrangement, a Bayer arrangement or an S-stripe arrangement, and the like. In addition, the sub-pixels 58B, 58G and 58R are not limited to the same shape or size.

Circuit Configuration of Electro-Optical Device

Figure 5:
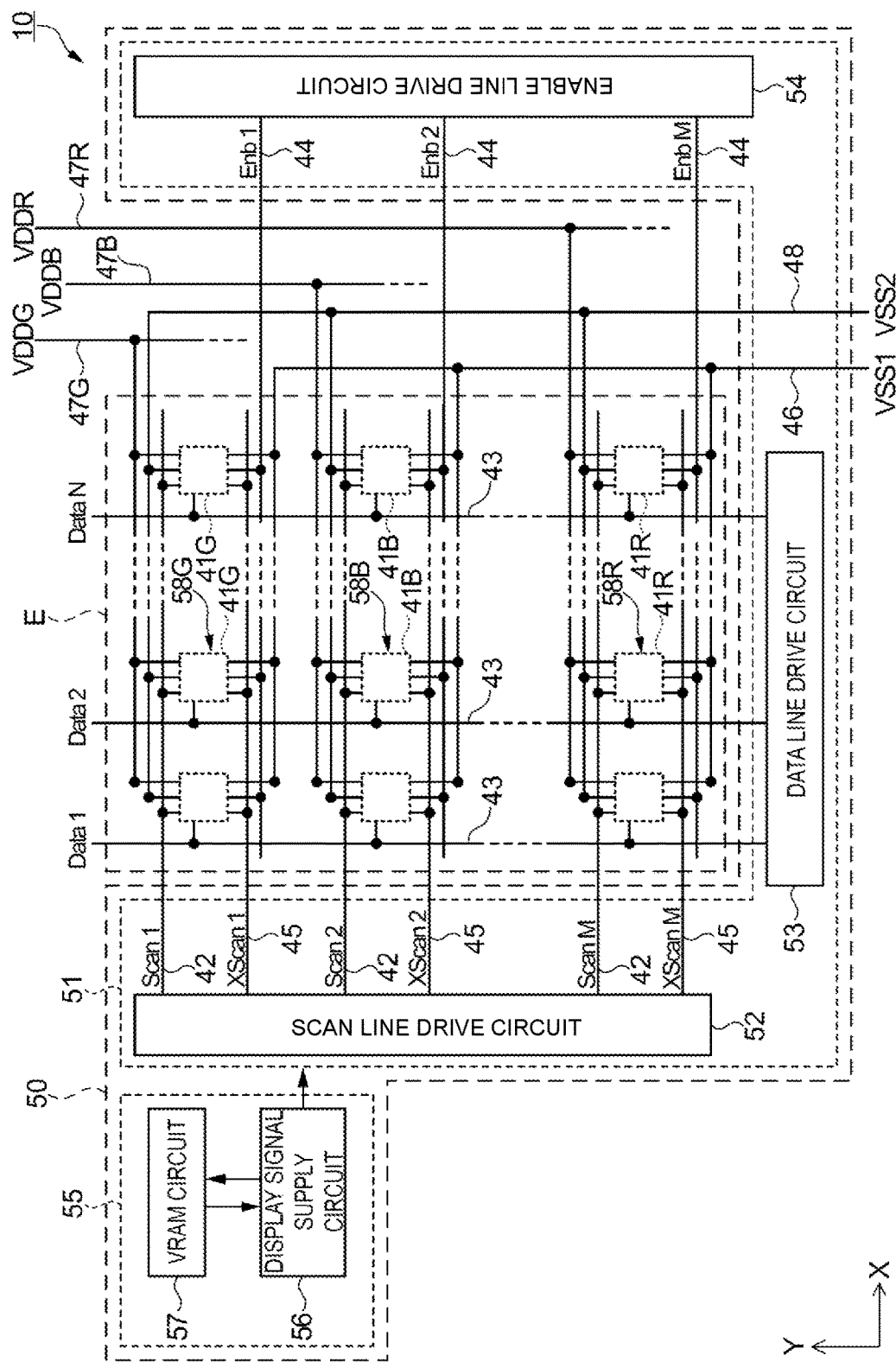
FIG. 5 illustrates a block diagram of a circuit of the electro-optical device according to the present exemplary embodiment.
Figure 6:
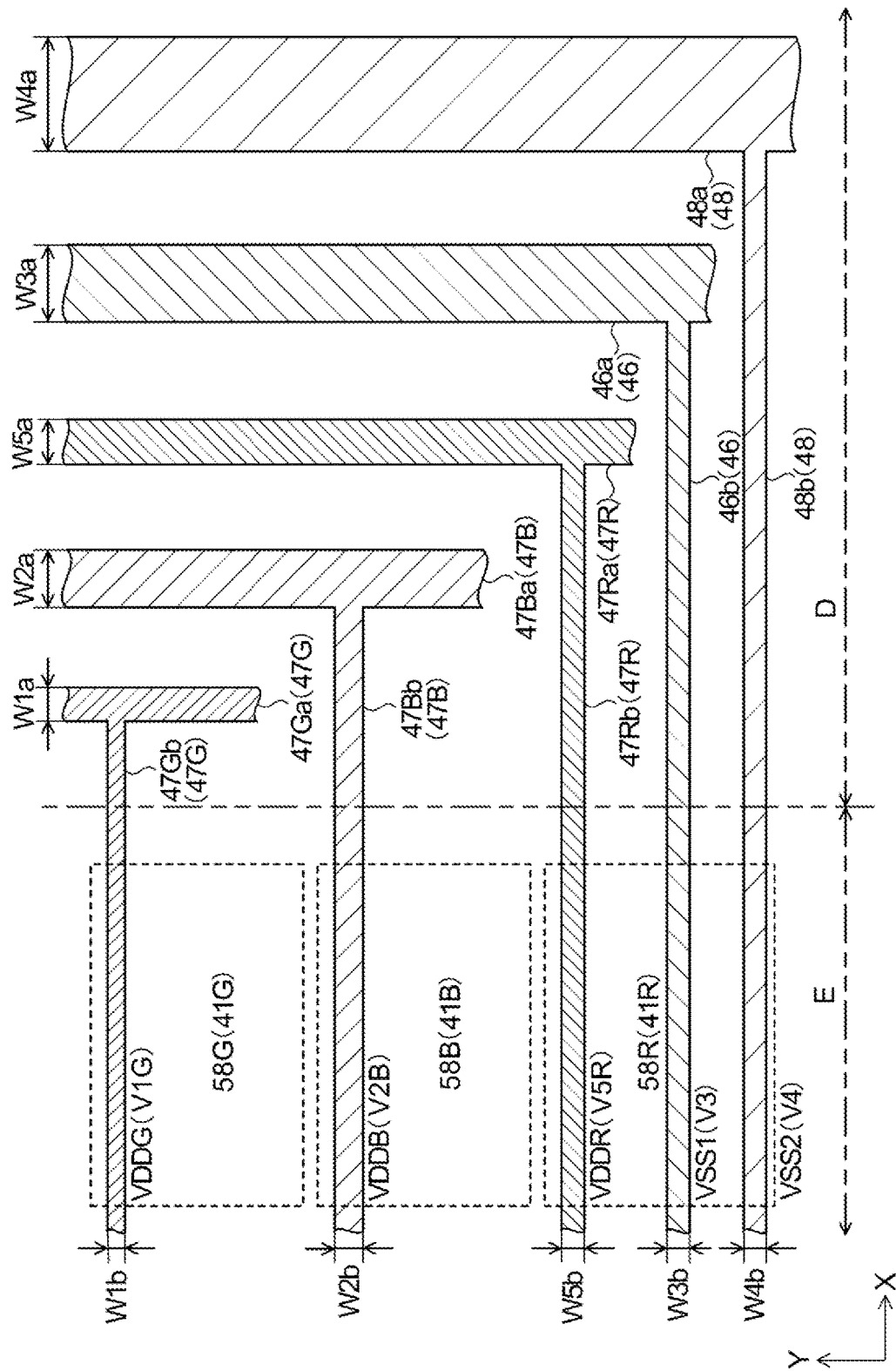
FIG. 6 illustrates a schematic diagram for describing wiring of the electro-optical device according to the present exemplary embodiment.

Next, a configuration of the circuit of the electro-optical device will be described with reference to FIG. 5 and FIG. 6. FIG. 5 illustrates a block diagram of the circuit of the electro-optical device according to the present exemplary embodiment. FIG. 6 illustrates a schematic diagram for describing wiring of the electro-optical device according to the present exemplary embodiment. As illustrated in FIG. 5, in the display region E of the electro-optical device 10, a plurality of first scan lines 42 and a plurality of data lines 43 intersecting with each other are formed and a plurality of sub-pixels 58 are arranged in a matrix corresponding to each respective intersection of the first scan lines 42 and the data lines 43. Each of the sub-pixels 58 is provided with a pixel circuit 41 including the light-emitting element 20 (see FIG. 9), and the like.

In the display region E of the electro-optical device 10, second scan lines 45 are formed corresponding to the respective first scan lines 42. In the display region E, enable lines 44 are formed corresponding to each of the first scan lines 42. The first scan lines 42, the second scan lines 45, and the enable lines 44 extend in the row direction (X direction). The data lines 43 extend in the column direction (Y direction).

In the electro-optical device 10, the sub-pixels 58 of M rows×N columns are arranged in matrix in the display region E. Specifically, in the display region E, M first scan lines 42, M second scan lines 45, M enable lines 44, and N data lines 43 are formed. Note that, M and N are integers greater than or equal to two, and M=720×p, N=1280 as an example in the present exemplary embodiment. Here, p is an integer greater than or equal to one and indicates the number of basic colors for display. In the present exemplary embodiment, a case where p=3, as an example, that is, the basic colors for display are three colors of G, B, and R will be described as an example.

For the sub-pixel 58G, the sub-pixel 58B, and the sub-pixel 58R of three colors, a pixel circuit 41G as an example of a first pixel circuit is arranged in the sub-pixel 58G, a pixel circuit 41B as an example of a second pixel circuit is arranged in the sub-pixel 58B, and a pixel circuit 41R as an example of a third pixel circuit is arranged in the sub-pixel 58R. The pixel circuit 41G, the pixel circuit 41B, and the pixel circuit 41R are arranged along the X direction as the first direction respectively. In other words, the pixel circuits 41G, the pixel circuits 41B, and the pixel circuits 41R of the same emission color are arranged so as to be adjacent to each other in the X direction.

The pixel circuit 41G includes a light-emitting element 20G as a first light-emitting element that emits G as a first color, the pixel circuit 41B includes a light-emitting element 20B as a second light-emitting element that emits B as a second color, and the pixel circuit 41R includes a light-emitting element 20R as a third light-emitting element that emits R as a third color (see FIG. 7). Note that, in the present specification, the pixel circuit 41G, the pixel circuit 41B, and the pixel circuit 41R may be collectively referred to as a pixel circuit 41 without distinction. In addition, the light-emitting element 20B, the light-emitting element 20G and the light-emitting element 20R may be collectively referred to as a light-emitting element 20 without distinction.

The electro-optical device 10 includes a driving unit 50 outside the display region E. The drive unit 50 supplies various signals to the respective pixel circuits 41 arranged in the display region E, such that an image in which the pixels 59 (with sub-pixels 58 of three colors) serve as units of display is displayed in the display region E. The driving unit 50 includes a drive circuit 51 and a control unit 55. The control unit 55 supplies a display signal to the drive circuit 51. The drive circuit 51 supplies a drive signal to each of the pixel circuits 41 via the plurality of first scan lines 42, the plurality of second scan lines 45, the plurality of data lines 43, and the plurality of enable lines 44 based on the display signal.

Further, in the non-display region D and the display region E, a high potential line 47G as a first wiring for supplying a first potential to the pixel circuit 41G, a high potential line 47B as a second wiring for supplying a second potential to the pixel circuit 41B, and a high potential line 47R as a fifth wiring for supplying a fifth potential to the pixel circuit 41R are arranged. The high potential line 47G, the high potential line 47B, and the high potential line 47R extend in the X direction as the first direction along which the pixel circuits 41G, the pixel circuits 41B, and the pixel circuits 41R are arranged in the display region E. Note that, in the present specification, the high potential line 47G, the high potential line 47B, and the high potential line 47R may be collectively referred to as a high potential line 47 without distinction. The first potential, the second potential, and the fifth potential are all high potential (VDD), but are mutually independent, and their potentials can be set regardless of the other potential. Specifically, the first potential is a potential suitable for the first light-emitting element (light-emitting element 20G) regardless of the second potential or the fifth potential. Similarly, the second potential is a potential suitable for the second light-emitting element (light-emitting element 20B) regardless of the fifth potential or the first potential. Further, the fifth potential is a potential suitable for the third light-emitting element (light-emitting element 20R) regardless of the second potential or the first potential.

In the non-display region D and the display region E, a low potential line 46 as a third wiring for supplying a third potential, and a low potential line 48 as a fourth wiring for supplying a fourth potential to the pixel circuit 41G, the pixel circuit 41B, and the pixel circuit 41R are arranged. In the present exemplary embodiment, the low potential line 48 as the fourth wiring is arranged in the display region E, and is electrically connected to the cathode 23 of the light-emitting element 20 in each sub-pixel 58. Accordingly, even in a case where the electric resistance of the cathode 23 is high, the potential of the cathode 23 is uniform inside the display region E. In a case where the electric resistance of the cathode 23 is relatively low, the low potential line 48 as the fourth wiring in the display region E may be eliminated, and the low potential line 48 as the fourth wiring may be arranged only in the non-display region D.

In the present exemplary embodiment, the high potentials that are supplied to the pixel circuit 41G, the pixel circuit 41B, and the pixel circuit 41R are different from each other. Specifically, the first potential (V1G) supplied from the high potential line 47G to the pixel circuit 41G is a high potential VDDG (for example, V1G=VDDG=5.0 V), the second potential (V2B) supplied from the high potential line 47B to the pixel circuit 41B is a high potential VDDB (for example, V2B=VDDB=7.0 V), and the fifth potential (V5R) supplied from the high potential line 47R to the pixel circuit 41R is a high potential VDDR (for example, V5R=VDDR=6.0 V).

The first potential (V1G) supplied to the pixel circuit 41G, the second potential (V2B) supplied to the pixel circuit 41B, and the fifth potential (V5R) supplied to the pixel circuit 41R are respectively supplied from the high potential line 47G, the high potential line 47B, and the high potential line 47R, thus, they are mutually independent. "Independent" means that the value of a potential is freely determined regardless of the values of other potentials. For example, "the second potential is independent from the first and fifth potentials" means that the value of the second potential (V2B) is freely determined regardless of how much the first potential (V1G) and the fifth potential (V5R) are set to. In the present exemplary embodiment, the first potential (V1G), the second potential (V2B), and the fifth potential (V5R) supplied to the pixel circuits 41G, 41B, and 41R, respectively, are different from each other, but for example, two of them may be set to the same potential, and the remaining one may be set to a different potential.

The low potentials are common to the pixel circuit 41G, the pixel circuit 41B, and the pixel circuit 41R. Specifically, the third potential (V3) commonly supplied to the pixel circuits 41G, 41B, and 41R from the low potential line 46 is a first low potential VSS1 (for example, V3=VSS1=2.0 V), and the fourth potential (V4) commonly supplied to the pixel circuits 41G, 41B, and 41R from the low potential line 48 is a second low potential VSS2 (for example, V4=VSS2=0 V). The low potential line 46 and the low potential line 48 are provided independently from each other. Therefore, the third potential (V3) and the fourth potential (V4) are independent. The third potential (V3) is lower than the first potential (V1G), the second potential (V2B) and the fifth potential (V5R). The fourth potential (V4) is lower than the third potential (V3).

In the present exemplary embodiment, a low-voltage power supply is configured by the first low potential VSS1 (V3) respectively with the high potential VDDG (V1G), the high potential VDDB (V2B), and the high potential VDDR (V5R), and a high-voltage power supply is configured by the second low potential VSS2 (V4) respectively with the high potential VDDG (V1G), the high potential VDDB (V2B), and the high potential VDDR (V5R). In each pixel circuit 41G, 41B, and 41R, each of the high potentials VDDG, VDDB, and VDDR is a reference potential for the low-voltage power supply and the high-voltage power supply.

As illustrated in FIG. 6, each of the high potential line 47G, the high potential line 47B, the high potential line 47R, the low potential line 46, and the low potential line 48 have a portion extending along the X direction in the display region E and the non-display region D (hereinafter also referred to as a branch line) and a portion along a direction intersecting the X direction in the non-display region D (hereinafter also referred to as a main line). Note that, the direction intersecting the X direction includes the Y direction, but is not limited to the Y direction.

Taking the high potential line 47G as an example, the branch line 47Gb of the high potential line 47G extends from the display region E to the non-display region D along the X direction, and is electrically connected to the N columns of pixel circuits 41G arranged along the X direction. Since the pixel circuits 41G of M/p rows are arranged in the Y direction, M/p lines of the branch lines 47Gb of the high potential lines 47G are required. The M/p branch lines 47Gb of the high potential line 47G merge with the main line 47Ga of the high potential line 47G arranged in the non-display region D. Similarly, the M/p branch lines 47Bb of the high potential line 47B merge with the main line 47Ba of the high potential line 47B in the non-display region D, and the M/p branch lines 7Rb of the high potential line 47R merge with the main line 47Ra of the high potential line 47R in the non-display region D.

Since the low potential line 46 is electrically connected to all the pixel circuit 41G, the pixel circuit 41B, and the pixel circuit 41R, M lines of the branch lines 46b of the low potential line 46 are required. In the present exemplary embodiment, since p=3, the number of branch lines 46b of the low potential line 46 is three times the number of branch lines 47Gb, 47Bb, 47Rb of the high potential line 47G, the high potential line 47B, and the high potential line 47R, respectively. The M branch lines 46b of the low potential line 46 merge with the main line 46a of the low potential line 46 in the non-display region D.

On the other hand, the low potential line 48 is electrically connected to all the pixel circuit 41G, the pixel circuit 41B, and the pixel circuit 41R. Although the low potential line 48 may be configured by only the main line 48a, in the present exemplary embodiment, M branch lines 48b of the low potential line 48 electrically connected to all the pixel circuit 41G, the pixel circuit 41B, and the pixel circuit 41R are provided and merged with the main line 48a. Although details will be described later, the cathode 23 (see FIG. 9) of the light-emitting element 20G, the light-emitting element 20B, the light-emitting element 20R provided in the pixel circuit 41G, the pixel circuit 41B, the pixel circuit 41R is formed in a film shape across all the sub-pixel 58G, the sub-pixel 58B, the sub-pixel 58R as a common electrode, the branch line 48b of the low potential line 48 and the cathode 23 are electrically connected in the vicinity of each of the sub-pixels 58, and the outer edge of the cathode 23 is also electrically connected to the main line 48a of the low potential line 48.

Referring back to FIG. 5, the drive circuit 51 includes the scan line drive circuit 52, the data line drive circuit 53, and the enable line drive circuit 54. The drive circuit 51 is provided in the non-display region D (see FIG. 4). In the present exemplary embodiment, the drive circuit 51 and the pixel circuit 41 are formed on the element substrate 11 (single-crystal silicon wafer in the present exemplary embodiment) illustrated in FIG. 4. Specifically, the drive circuit 51, the pixel circuit 41, and the like are formed from elements, such as transistors, and the like which are formed on the single-crystal silicon wafer.

The first scan line 42 and the second scan line 45 are electrically connected to the scan line drive circuit 52. The scan line drive circuit 52 outputs a scan signal (Scan) that allows the pixel circuits 41 to be selected or unselected in the row direction to each of the first scan lines 42, and the first scan lines 42 transmit the scan signal to the pixel circuits 41. In other words, the scan signal has a selection state in which a selection transistor 32 (see FIG. 9) turns to an ON-state and a non-selection state in which the selection transistor 32 turns to an OFF-state, the first scan lines 42 can be appropriately selected, receiving the scan signal from the scan line drive circuit 52.

As described later, in the present exemplary embodiment, since the selection transistor 32 is P-type, the scan signal (selection signal) in the selection state is Low (low potential), and the scan signal (non-selection signal) in the non-selection state is High (high potential). The potential of the selection signal is set to a low potential lower than or equal to the first low potential VSS1 (V3), and is preferably the second low potential VSS2 (V4). The potential of the non-selection signal is preferably the highest potential (V2B=VDDB=7.0 V in the present exemplary embodiment) among the first potential (V1G), the second potential (V2B), and the fifth potential (V5R).

The scan line drive circuit 52 outputs a second scan signal (XScan) that allows the pixel circuits 41 to be signal-maintained or non-signal-maintained in the row direction to each of the second scan lines 45, and the second scan lines 45 transmit the second scan signal to the pixel circuits 41. In other words, the second scan signal has a maintain signal for turning a maintain transistor 33 (see FIG. 9) to an ON-state and a non-maintain signal for turning the maintain transistor 33 to an OFF-state. The second scan lines 45 receive these second scan signals from the scan line drive circuit 52.

As described later, in the present exemplary embodiment, since the maintain transistor 33 is P-type, the second scan signal (maintain signal) in a signal-maintain state is Low (low potential), and the second scan signal (non-maintain signal) in a non-signal-maintain state is High (high potential). The potential of the maintain signal is set to a low potential lower than or equal to the lowest potential among the first potential (V1G), the second potential (V2B), and the fifth potential (V5R), and lower than or equal to the first low potential VSS1 (V3), and is preferably the second low potential VSS2 (V4). The potential of the non-maintain signal is preferably the highest potential (V2B=VDDB=7.0 V in the present exemplary embodiment) among the first potential (V1G), the second potential (V2B), and the fifth potential (V5R).

Note that, when the scan signal supplied to the first scan line 42 of the i-th row among the M first scan lines 42 is specified, the scan signal is denoted as a scan signal Scan i in the i-th row. Similarly, when the scan signal supplied to the second scan line 45 of the i-th row among the M second scan lines 45 is specified, the second scan signal is denoted as a second scan signal XScan i in the i-th row. The scan line drive circuit 52 includes a shift register circuit, which is not illustrated, and a signal for shifting the shift register circuit is output as a shift output signal for each stage. With this shift output signal, the scan signal Scan 1 of the first row to the scan signal Scan M of the M-th row supplied to each of the first scan lines 42 and the second scan signal XScan 1 of the first row to the second scan signal XScan M of the M-th row supplied to each of the second scan lines 45 are formed.

Data lines 43 are electrically connected to the data line drive circuit 53. The data line drive circuit 53 includes a shift register circuit, or a decoder circuit, or a multiplexer circuit, or the like (not illustrated). The data line drive circuit 53 supplies image signal (Data) to each of the N data lines 43 in synchronization with the selection of the first scan lines 42. The image signal is a digital signal that takes either the first low potential VSS1 (V3) or the highest potential (V2B=VDDB=7.0 V in the present exemplary embodiment) among the first potential (V1G), the second potential (V2B), and the fifth potential (V5R). Note that, when an image signal supplied to a data line 43 of the j-th column among the N data lines 43 is specified, the image signal is denoted as an image signal Data j in the j-th column.

The scan lines 42 are electrically connected to the scan line drive circuit 52. The enable line drive circuit 54 outputs enable signals which are specific to the rows to the enable lines 44 which separately correspond to the respective rows. The enable signals are specific to the rows. The enable line 44 transmits the enable signal to the pixel circuit 41 in the corresponding row. The enable signal has an active state and a non-active state, and the enable line 44 can receive the enable signal from the enable line drive circuit 54 and can be appropriately turned into the active state. The enable signal takes a potential between the second low potential VSS2 (V4) and the highest potential (V2B=VDDB=7.0 V in the present exemplary embodiment) among the first potential (V1G), the second potential (V2B), and the fifth potential (V5R).

As described later, in the present exemplary embodiment, since an enable transistor 34 is P-type (see FIG. 9), the enable signal (active signal) in the active state is Low (low potential), and the enable signal (non-active signal) in the non-active state is High (high potential). The active signal is set to a low potential lower than or equal to the first low potential VSS1 (V3), and is preferably the second low potential VSS2 (V4). The potential of the non-active signal is preferably the highest potential (V2B=VDDB=7.0 V in the present exemplary embodiment) among the first potential (V1G), the second potential (V2B), and the fifth potential (V5R).

Note that, when an enable signal supplied to an enable line 44 of the i-th row among the M enable lines 44 is specified, the enable signal is denoted as an enable signal Enb i in the i-th row. The enable line drive circuit 54 may supply the active signal (or the non-active signal) as an enable signal to each row, or may supply the active signal (or the non-active signal) simultaneously to a plurality of rows. In the present exemplary embodiment, the enable line drive circuit 54 supplies the active signal (or the non-active signal) simultaneously to all of the pixel circuits 41 located in the display region E through the enable lines 44.

The control unit 55 includes a display signal supply circuit 56 and a video random access memory (VRAM) circuit 57. The VRAM circuit 57 temporarily stores a frame image and the like. The display signal supply circuit 56 generates a display signal (such as an image signal and a clock signal) from a frame image temporarily stored in the VRAM circuit 57 and supplies the display signal to the drive circuit 51.

In the present exemplary embodiment, the drive circuit 51 and the pixel circuits 41 are formed on the element substrate 11 (single-crystal silicon wafer in the present exemplary embodiment). Specifically, the drive circuit 51 and the pixel circuits 41 are formed of transistor elements formed on the single-crystal silicon wafer.

The control unit 55 is configured by a semiconductor integrated circuit formed on a substrate (not illustrated) formed of a single-crystal semiconductor substrate, and the like, which differs from the element substrate 11. The substrate on which the control unit 55 is formed is coupled to the external coupling terminals 13 provided on the element substrate 11 with a flexible printed circuit (FPC). Via the FPC, the display signal is supplied to the drive circuit 51 from the control unit 55.

Configuration of Pixel

Next, a configuration of a pixel according to the present exemplary embodiment will be described with reference to FIG. 7. FIG. 7 illustrates a diagram for describing the configuration of the pixel according to the present exemplary embodiment.

As described above, in the electro-optical device 10, the pixel 59 including the sub-pixels 58 (the sub-pixel 58G, 58B, 58R) serves as a unit of display to display an image. In the present exemplary embodiment, the length a of the sub-pixel 58 in the row direction (X direction) is 12 μm and the length b of the sub-pixel 58 in the column direction (Y direction) is 4 μm. In other words, the pitch at which the sub-pixels 58 are arranged in the row direction (X direction) is 12 μm, and the pitch at which the sub-pixels 58 are arranged in the column direction (Y direction) is 4 μm.

Each of the sub-pixels 58 is provided with the pixel circuit 41 including the light-emitting element (LED) 20. In the present exemplary embodiment, the basic colors p=3, the pixel circuit 41G, the pixel circuit 41B, and the pixel circuit 41R are provided corresponding to the sub-pixels 58G, the sub-pixels 58B, and the sub-pixels 58R respectively. The pixel circuit 41G includes a light-emitting element 20G that emits light of G, the pixel circuit 41B includes a light-emitting element 20B that emits light of B, and the pixel circuit 41R includes a light-emitting element 20R that emits light of R.

In the present exemplary embodiment, an organic electro luminescence (EL) element is used as one example of the light-emitting element 20G, 20B, 20R. The organic EL elements of the light-emitting element 20G, the light-emitting element 20B, and the light-emitting element 20R are formed of light-emitting materials that emit light of different colors G, B, and R corresponding to the sub-pixel 58G, 58B, and 58R.

Note that, the light-emitting element 20 may be an organic EL element that emits white light, and may have an optical resonant structure that enhances the intensity of light with a specific wavelength. That is, a configuration may be such that a green light component is extracted from the white light emitted from the light-emitting element 20 in the sub-pixel 58G; a blue light component is extracted from the white light emitted from the light-emitting element 20 in the sub-pixel 58B; and a red light component is extracted from the white light emitted from the light-emitting element 20 in the sub-pixel 58R.

Further, it may include a color filter (not illustrated) including a light-emitting element 20 that emits white light to each of the pixel circuit 41G, the pixel circuit 41B, and the pixel circuit 41R, and through which light emitted from the light-emitting element 20 passes. In the case of such a configuration, the color filter includes color filters of colors corresponding to the basic color p=3 of display, and the color filters of each colors of G, B, R are arranged corresponding to each of the sub-pixels 58G, the sub-pixels 58B, and the sub-pixels 58R, respectively.

In addition to the above example, the configuration may include a light-emitting element 20 that emits light of color other than G, B, and R as the basic color p=4. In addition to the color filter for G, B, R, a color filter for another color, for example, a color filter for white light (sub-pixel 58 substantially without color filter) may be prepared, or a color filter for other color light such as yellow, cyan, and the like, may be prepared. Furthermore, a light emitting diode element such as gallium nitride (GaN), a semiconductor laser element, and the like may be used as the light-emitting element 20.

Digital Driving in Electro-Optical Device

Figure 8:
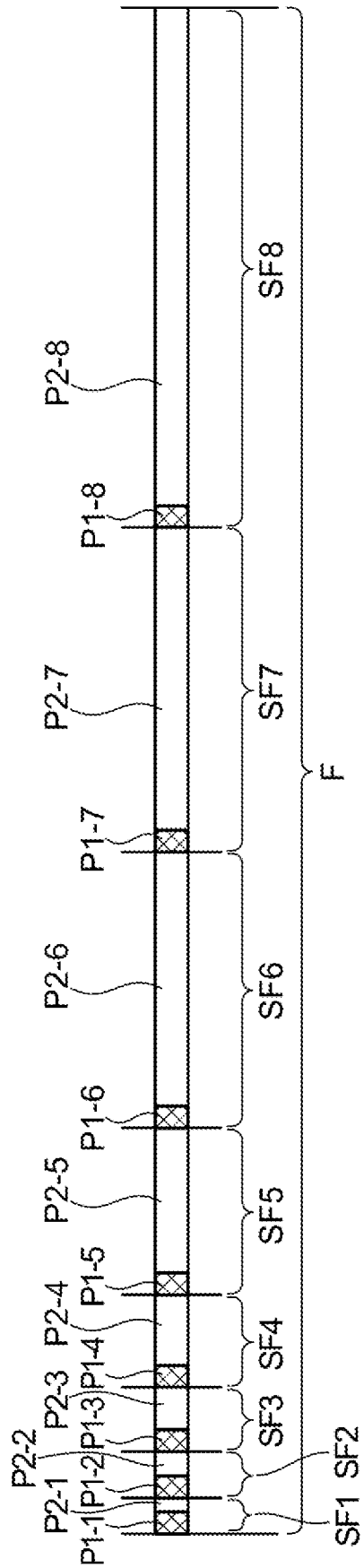
FIG. 8 illustrates a diagram for describing digital driving in the electro-optical device according to the present exemplary embodiment.

Next, a method for displaying an image by digital driving in the electro-optical device 10 according to the present exemplary embodiment will be described with reference to FIG. 8. FIG. 8 illustrates a diagram for describing the digital driving in the electro-optical device according to the present exemplary embodiment.

The electro-optical device 10 displays a predetermined image in the display region E (see FIG. 4) by digital driving. That is, the light-emitting element 20 (see FIG. 7) arranged in each of the sub-pixels 58 takes a state of one of the binary values, namely emission (bright state) and non-emission (dark state) states, and the gray scale of an image to be displayed depends on the ratio of a light emission period of the light-emitting element 20. This is referred to as time-division driving.

As illustrated in FIG. 8, in the time-division driving, a single field (F) displaying one image is divided into a plurality of sub-fields (SF) and the gray-scale display is expressed by controlling emission state and non-emission state of the light-emitting element 20 for each of the sub-fields (SF). A case where a display with $2^8=256$ gray scales is performed by an 8-bit time-division gray scale system will be described as one example. In the 8-bit time-division gray scale system, the single field F is divided into eight sub-fields, namely SF1 to SF8.

In FIG. 8, in the single field F, the i-th sub-field is indicated by SFi and the eight sub-fields including the first sub-field SF1 to the eighth sub-field SF8 are illustrated. Each of the sub-fields SF includes a display period P2 (P2-1 to P2-8) as a second period and, optionally, a non-display period (signal-writing period) P1 (P1-1 to P1-8) as a first period as necessary.

Note that, in this specification, the sub-fields SF1 to SF8 may be collectively referred to as a sub-field SF without distinction, the non-display periods P1-1 to P1-8 may be collectively referred to as a non-display period P1 without distinction, and the display periods P2-1 to P2-8 may be collectively referred to as a display period P2 without distinction.

The light-emitting element 20 is placed either in the emission state or non-emission state during the display period P2 and in the non-emission-state during the non-display period (signal-writing period) P1. The non-display period P1 is used, for example, to write an image signal to a memory circuit 60 (see FIG. 9) and adjust display time, and the like, and in a case where the shortest sub-field (for example, SF1) is relatively long, the non-display period P1 (P1-1) can be eliminated.

In the 8-bit time-division gray scale system, the display period P2 (P2-1 to P2-8) of each of the sub-fields SF is set such that (P2-1 of SF1):(P2-2 of SF2):(P2-3 of SF3):(P2-4 of SF4):(P2-5 of SF5):(P2-6 of SF6):(P2-7 of SF7):(P2-8 of SF8)=1:2:4:8:16:32:64:128. For example, in a case where an image is displayed by a progressive system with a frame frequency of 60 Hz, then, 1 frame=1 field (F)=16.7 milliseconds (msec).

In the present exemplary embodiment, as described later, the non-display period P1 (P1-1 to P1-8) of each sub-field SF is about 10.8 microseconds (μsec). In this case, (P2-1 of SF1)=0.065 msec, (P2-2 of SF2)=0.130 msec, (P2-3 of SF3)=0.260 msec, (P2-4 of SF4)=0.520 msec, (P2-5 of SF5)=1.040 msec, (P2-6 of SF6)=2.081 msec, (P2-7 of SF7)=4.161 msec, (P2-8 of SF8)=8.323 msec.

Here, the duration of the non-display period P1 is represented as x second (sec), the duration of the shortest display period P2 (the display period P2-1 of the first sub-field SF1 in the case of the example described above) is represented as y (sec), the number of bits of gray scale (=the number of sub-fields SF) is represented as g, and the field frequency is represented as f (Hz), their relationship is represented by Mathematical Equation 1 below:

[Mathematical Equation 1]

$$gx+(2^g-1)y=1/f \qquad (1)$$

In the design rule of the present exemplary embodiment, a second inverter 62 is a typical inverter used in the drive circuit 51. In this case, the charging time $\tau_2$ (delay time per inverter) of the input terminal 28 of the second inverter 62 is about $\tau_2=1.5\times10^{-11}$ sec, and this time corresponds to the delay time per inverter included in the drive circuit 51. As a result, the reciprocal (shortest time) of the maximum operating frequency of the shift register circuit included in the drive circuit 51 is about $1\times10^{-10}$ sec, which is approximately 11 times the delay time per inverter, and therefore the maximum operating frequency of the shift register circuit becomes about 10 GHz. Generally, the stable operation of the circuit is less than half of the maximum operating frequency, but in consideration of the margin, it is preferable to set the operation frequency of the shift register circuit of the drive circuit 51 to about less than or equal to 2 GHz.

In the present exemplary embodiment, as will be described in detail later, the selection time of one first scan line 42 can be shortened to about 20 picoseconds (picosec). However, if the selection time is shortened to such a degree, the data line drive circuit 53 may not operate. Therefore, a horizontal stripe arrangement in which the sub-pixels 58 are arranged in the row direction (X direction) is adopted, M rows×N columns are respectively set as M=720×3=2160, and N=1280. Assuming that the data line drive circuit 53 is a q-phase expansion (q=128, and 128 lines per sets are arranged in parallel in the present exemplary embodiment), N/q=10 sets are selected within the selection time of one of the first scan line 42. Therefore, the allocation time per set is ¹⁄₁₀ of the selection time of one of the first scan line 42.

The allocation time corresponding to 2 GHz of the stable operating frequency at which the shift register circuit operates stably is 0.5 nanoseconds (nanosec) in this reciprocal, thus, this is allocated to the previous set. In short, the data line drive circuit 53 operates with a clock of 2 GHz. In this case, the selection time of one first scan line 42 is 5 nanoseconds, and the driving frequency of the scan line drive circuit 52 is about 200 MHz. Also, one vertical period that all the first scan lines 42 have been selected is 5 (nanosec)×720×3=10.8 microseconds, which serves as the non-display period P1.

The digital driving in the electro-optical device 10 displays grey scale based on the ratio of sum of the light emission periods to the total display periods P2 in the single field F. For example, for black display corresponding to a gray scale "0", the light-emitting element 20 is in the non-emission state during all of the display periods P2-1 to P2-8 of the eight sub-fields SF1 to SF8. On the other hand, for white display corresponding to a gray scale "255", the light-emitting element 20 is in emission state during all of the display periods P2-1 to P2-8 in the eight sub-fields SF1 to SF8.

In addition, to obtained display with an intermediate luminance corresponding to, for example, a gray scale "7" of the 256 gray scales, the light-emitting element 20 is placed in the emission state during the display period P2-1 in the first sub-field SF1, the display period P2-2 in the second sub-field SF2, and the display period P2-3 in the third sub-field SF3, while the light-emitting element 20 is placed in the non-emission state during the display periods P2-4 to P2-8 in the other sub-fields SF4 to SF8. In this way, the state of the light-emitting element 20 may be selected to be the emission state or the non-emission state of light as appropriate for each of the sub-fields SF constituting the single field F so as to display an intermediate gray scale.

By the way, according to a typical analog driving electro-optical device (organic EL device), since a gray-scale display is performed by analog control of a current flowing through an organic EL element according to the gate potential of a drive transistor, such that a variation in luminance and a deviation in gray scale occur between pixels and a display quality decreases due to a variation in current-voltage characteristics and a threshold voltage of the drive transistor. On the other hand, when a compensation circuit that compensates for the variation in current-voltage characteristics and the threshold voltage of a drive transistor as described in JP-A-2002-287695, a current also flows through the compensation circuit, thus increasing power consumption.

Also, in the typical organic EL device, a capacitance of a capacitor that stores an image signal as an analog signal needs to be increased in order to achieve multiple gray scales of display, thus, it is difficult to achieve a higher resolution (finer pixels) at the same time, and power consumption also increases due to charge and discharge of a large capacitor. In other words, in a typical organic EL device, there is a problem that in an electro-optical device that can display a high-resolution, multiple gray scales and high-quality image at low power consumption is difficult to achieve.

In the electro-optical device 10 according to the present exemplary embodiment, the light-emitting element 20 is operated based on binary values of ON and OFF, so that the light-emitting element 20 is placed into either one of binary states of emission or non-emission. Thus, compared to the case of analog driving, it is less likely to be affected by variations in current-voltage characteristics and threshold voltage of a transistor, thus a high-quality displayed image with less deviations in luminance and less unevenness in gray scale between the pixels 59 (sub-pixels 58) can be obtained. Furthermore, a capacitor in digital driving does not need to have a large capacitance as required in the case of analog driving, thus, not only a finer pixel 59 (sub-pixels 58) can be achieved, but the resolution can also be easily improved and the power consumption due to charge and discharge of a large capacitor can be reduced.

Moreover, according to the digital driving in the electro-optical device 10, the number of gray scales can be readily increased by increasing the number g of sub-fields SF in a field F. In this case, even though the non-display periods P1 exist as described above, the number of gray scales can increased by simply shortening the shortest display period P2. For example, in a case where the display of 1024 gray scales with g=10 in the progressive method with the frame frequency f=60 Hz, in a case where the time of the non-display period P1 is x=10.8 microseconds, the time of the shortest display period may be set to only y=0.016 milliseconds according to Mathematical Equation 1.

As described later, in digital driving of the electro-optical device 10, the non-display period P1 as the first period can be assigned to a signal-writing period during which an image signal is written to the memory circuit 60 (or a signal-rewriting period during which an image signal is rewritten). Accordingly, 8-bit gray-scale display can be easily converted to 10-bit gray-scale display without changing the signal-writing period (that is, without changing the clock frequency of the drive circuit 51).

Furthermore, in digital driving of the electro-optical device 10, the image signal of the memory circuit 60 (see FIG. 9) of the sub-pixel 58 changing the display is rewritten among the sub-fields SF or among the fields F, only if the memory circuit 60 is in the sub-pixel 48 that is to be changed. On the other hand, the image signal of the memory circuit 60 of a sub-pixel 58 not changing the display is not rewritten (maintained), thus, the power consumption can be reduced. That is, with this configuration, the electro-optical device 10 can be achieved that can display an image having a multiple gray scales and a high resolution as well as variation in brightness and a small deviation in gray scale among the pixels 59 (sub-pixels 58) and reduce energy consumption.

EXAMPLE 1

Configuration of Pixel Circuit

Figure 9:
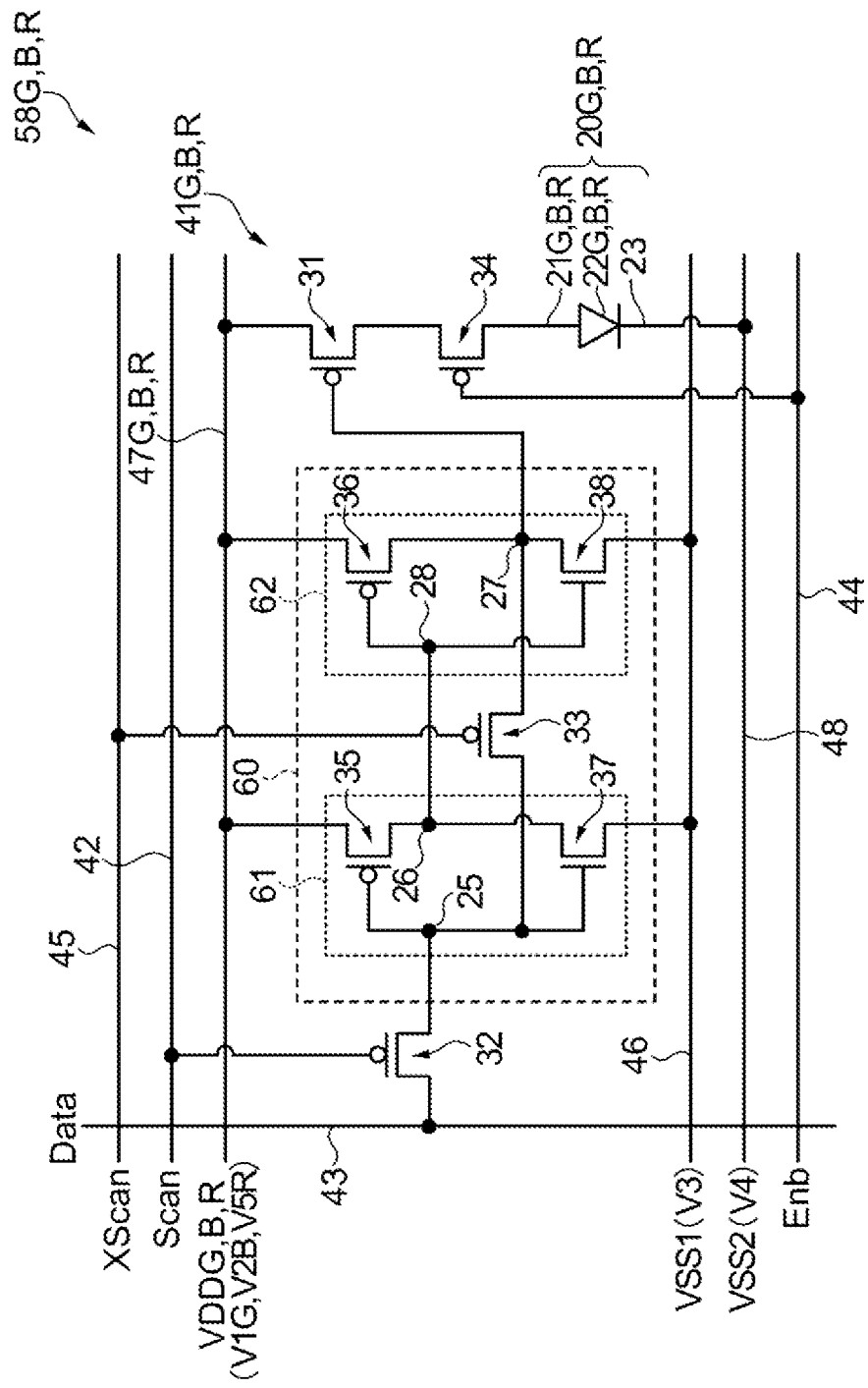
FIG. 9 illustrates a diagram for describing a configuration of a pixel circuit according to Example 1.

Next, a configuration of a pixel circuit according to Example 1 will be described with reference to FIG. 9. FIG. 9 illustrates a diagram for describing the configuration of the pixel circuit according to Example 1.

As illustrated in FIG. 9, a pixel circuit 41 is provided for each of sub-pixels 58 that are arranged to correspond to the respective intersections of the first scan lines 42 and the data lines 43. A second scan line 45 and an enable line 44 are arranged along the first scan line 42. The first scan line 42, the second scan line 45, the data line 43, and the enable line 44 correspond to each pixel circuit 41.

In FIG. 9, components different from each other among the pixel circuit 41G, the pixel circuit 41B, and the pixel circuit 41R are denoted by G, B, and R. The components common among the pixel circuit 41G, the pixel circuit 41B, and the pixel circuit 41R are not denoted by G, B, and R. In the following description, different matters in the pixel circuits 41G, 41B, and 41R will be described by attaching G, B, and R, and matters common to the pixel circuits 41G, 41B, and 41R will be described by omitting G, B, and R.

In Example 1, to each pixel circuit 41G, the first potential (V1G=VDDG) is supplied from the high potential line 47G as the first wiring, the third potential (V3=VSS1) is supplied from the low potential line 46 as the third wiring, and the fourth potential (V4=VSS2) is supplied from the low potential line 48 as the fourth wiring. To each pixel circuit 41B, the second potential (V2B=VDDB) is supplied to each pixel circuit 41B from the high potential line 47B as the second wiring, the third potential (V3=VSS1) is supplied from the low potential line 46 as the third wiring, and the fourth potential (V4=VSS2) is supplied from the low potential line 48 as the fourth wiring. To each pixel circuit 41R, the fifth potential (V5R=VDDR) is supplied to each pixel circuit 41R from the high potential line 47R as the fifth wiring, the third potential (V3=VSS1) is supplied from the low potential line 46 as the third wiring, and the fourth potential (V4=VSS2) is supplied from the low potential line 48 as the fourth wiring.

The pixel circuit 41 according to the Example 1 includes a P-type drive transistor 31, a light-emitting element 20, a P-type enable transistor 34, a memory circuit 60, and a P-type selection transistor 32. The pixel circuit 41 includes the memory circuit 60, thus, the electro-optical device 10 is driven digitally. As a result, the variation in the emission luminance of the light-emitting element 20 among the sub-pixels 58 is suppressed as compared with the case of analog driving, and variation in display among the pixels 59 is reduced.

The pixel circuit 41G as the first pixel circuit includes a drive transistor 31 as a first transistor electrically connected in series to the light-emitting element 20G. The pixel circuit 41B as the second pixel circuit includes a drive transistor 31 as a second transistor electrically connected in series to the light-emitting element 20B. The pixel circuit 41R as the third pixel circuit includes a drive transistor 31 as a third transistor electrically connected in series to the light-emitting element 20R. The drive transistor 31 included in the pixel circuit 41G, the drive transistor 31 included in the pixel circuit 41B, and the drive transistor 31 included in the pixel circuit 41R are elements of the same conductivity type. The drive transistor 31, the enable transistor 34, and the light-emitting element 20 in the first pixel circuit are arranged in series between the first wiring (high potential line 47) and the fourth wiring (low potential line 48). The drive transistor 31, the enable transistor 34, and the light-emitting element 20 in the second pixel circuit are arranged in series between the second wiring (high potential line 47) and the fourth wiring (low potential line 48). The drive transistor 31, the enable transistor 34, and the light-emitting element 20 in the third pixel circuit are arranged in series between the fifth wiring (high potential line 47) and the fourth wiring (low potential line 48).

The pixel circuit 41G as the first pixel circuit includes a memory circuit 60 as a first memory circuit. The pixel circuit 41B as the second pixel circuit includes a memory circuit 60 as a second memory circuit. The pixel circuit 41R as the third pixel circuit includes a memory circuit 60 as a third memory circuit. The memory circuit 60 included in the pixel circuit 41G, the memory circuit 60 included in the pixel circuit 41B, and the memory circuit 60 included in the pixel circuit 41R have the same configuration. The memory circuit 60 in the first pixel circuit is arranged between the first wiring (high potential line 47) and the third wiring (low potential line 46). The memory circuit 60 in the second pixel circuit is arranged between the second wiring (high potential line 47) and the third wiring (low potential line 46). The memory circuit 60 in the third pixel circuit is arranged between the fifth wiring (high potential line 47) and the third wiring (low potential line 46). The selection transistor 32 is arranged between the memory circuit 60 and the data line 43.

The memory circuit 60 includes a first inverter 61, a second inverter 62, and a P-type maintain transistor 33. The memory circuit 60 is configured to include the two inverters 61 and 62 electrically connected together in a circle to form a so-called static memory to store a digital signal, which is an image signal.

The output terminal 26 of the first inverter 61 is electrically connected to the input terminal 28 of the second inverter 62. The maintain transistor 33 is arranged between the output terminal 27 of the second inverter 62 and the input terminal 25 of the first inverter 61. That is, one of the source and the drain of the maintain transistor 33 is electrically connected to the input terminal 25 of the first inverter 61, and the other is electrically connected to the output terminal 27 of the second inverter 62.

In this specification, the state where a terminal (for output or input) A and a terminal (for output or input) B are electrically connected to each other means a state where the logic of the terminal A and the logic of the terminal B can be equal. For example, even when a transistor, a resistor, a diode, and the like are arranged between the terminal A and the terminal B, the terminals can be regarded as a state of electrically connected. Further, "dispose" as used in the expression "a transistor and other elements are arranged between A and B" does not mean how these elements are arranged on a lay-out, but means how these elements are arranged in a circuit diagram.

A digital signal stored in the memory circuit 60 has the binary potentials of High or Low. In the present exemplary embodiment, in the case where the potential of the output terminal 26 of the first inverter 61 is Low (in the case where the output terminal 27 of the second inverter 62 is High), the light-emitting element 20 is turned into a state that allows emission, whereas in the case where the potential of the output terminal 26 of the first inverter 61 is High (in the case where the output terminal 27 of the second inverter 62 is Low), the light-emitting element 20 is turned into a non-emission state.

In Example 1, two inverters 61 and 62 constituting the memory circuit 60 are arranged between the high potential lines 47G, 47B, and 47R and the third wiring (low potential line 46), and VDDG, VDDB, and VDDR (V1G, V2B, V5R) as high potentials and VSS1 (V3) as a third potential are supplied to the two inverters 61 and 62. Therefore, the High potentials of pixel circuit 41G, 41B and 41R are set to VDDG, VDDB, VDDR (V1G, V2B, V5R) different for each other, and Low potentials of the pixel circuits 41G, 41B, and 41R are commonly set to be VSS1 (V3).

When a digital signal is stored in the memory circuit 60 and the potential of the output terminal 26 of the first inverter 61 is turned into Low, for example, Low is input to the input terminal 28 of the second inverter 62 and the potential of the output terminal 27 of the second inverter 62 is turned into High. When the potential of the output terminal 27 of the second inverter 62 is High and the maintain transistor 33 is in the ON-state, High is input from the output terminal 27 of the second inverter 62 to the input terminal 25 of the first inverter 61, and the potential of the output terminal 26 of the first inverter 61 is turned into Low. In this way, when the maintain transistor 33 is in the ON-state, the digital signal stored in the memory circuit 60 is maintained in a stable state until it is rewritten next time.

The first inverter 61 includes a P-type transistor 35 and an N-type transistor 37, and is a CMOS configuration. The transistor 35 and the transistor 37 are arranged in series between the high potential line 47 and the third wiring (low potential line 46). The source of the N-type transistor 37 is electrically connected to the third wiring (low potential line 46). The source of the P-type transistor 35 is electrically connected to the high potential line 47.

The second inverter 62 includes a P-type transistor 36 and an N-type transistor 39, and is a CMOS configuration. The transistor 36 and the transistor 38 are arranged in series between the high potential line 47 and the third wiring (low potential line 46). The source of the P-type transistor 36 is electrically connected to the high potential line 47. The source of the N-type transistor 38 is electrically connected to the third wiring (low potential line 46).

Note that for an N-type transistor, the source is defined so that the source potential is lower than the drain potential. For a P-type transistor, the source is defined so that the source potential is higher than the drain potential.

The input terminal 25 of the first inverter 61 is the gate of the transistor 35 and the transistor 37, and is electrically connected to one of the source and the drain of the maintain transistor 33. The output terminal 26 of the first inverter 61 is the drain of the transistor 35 and the transistor 37, and is electrically connected to the input terminal 28 of the second inverter 62.

The output terminal 27 of the second inverter 62 is the drain of the transistor 36 and the transistor 38, and is electrically connected to the other of the source and drain of the maintain transistor 33. The input terminal 28 of the second inverter 62 is the gate of the transistor 36 and the transistor 38, and is electrically connected to the output terminal 26 of the first inverter 61.

Note that, in Example 1, the first inverter 61 and the second inverter 62 both constitute a CMOS configuration, but the inverters 61 and 62 may be configured to include transistors and a resistors. For example, one of the transistor 35 and the transistor 37 may be replaced with a resistance element in the first inverter 61, or one of the transistor 36 and the transistor 38 may be replaced with a resistance element in the second inverter 62.

The light-emitting element 20 is an organic EL element in the present exemplary embodiment, and includes an anode (pixel electrode) 21, a light-emitting unit (light emission functional layer) 22, and a cathode (counter electrode) 23. The anodes 21G, 21B, and 21R are patterned for each of the pixel circuits 41G, 41B, and 41R (sub-pixels 58G, 58B, and 58R). The anodes 21G, 21B, and 21R may have the same configuration, or may have different planar shapes and film thicknesses for each of the pixel circuits 41G, 41B, and 41R.

The light-emitting unit 22 is configured so as to emit light by a part of energy as fluorescence or phosphorescence when an exciton is formed by a positive hole injected from the anode 21 side and an electron injected from the cathode 23 side and the exciton disappears (the positive hole recombines with the electron). In Example 1, the light-emitting units 22G, 22B, and 22R are formed using different light-emitting materials for the pixel circuits 41G, 41B, and 41R, respectively. Specifically, the light-emitting unit 22G is formed of light-emitting materials that emit green light, the light-emitting unit 22B is formed of light-emitting materials that emit blue light, and the light-emitting unit 22R is formed of light-emitting materials that emit red light.

The cathode 23 serves as a common electrode of the light-emitting elements 20G, 20B, and 20R of the pixel circuits 41G, 41B, and 41R, and is formed in a film shape to cover the light-emitting units 22G, 22B, and 22R over the sub-pixels 58G, 58B, and 58R arranged in a matrix in the display region E. The cathode 23 is formed from the display region E to outside the non-display region D, and the outer edge of the cathode 23 is electrically connected to the low potential line 48 arranged in the non-display region D.

In the pixel circuit 41 according to Example 1, the light-emitting element 20 is arranged between the enable transistor 34 and the low potential line 48. In other words, the light-emitting element 20 is electrically connected to the high potential line 47 via the enable transistor 34 and the drive transistor 31. The anode 21 of the light-emitting element 20 is electrically connected to the drain of the enable transistor 34, and the cathode 23 of the light-emitting element 20 is electrically connected to the low potential line 48.

The drive transistor 31 is a drive transistor with respect to the light-emitting element 20. That is, when the drive transistor 31 is turned into the ON-state, the light-emitting element 20 can emit light. The gate of the drive transistor 31 is electrically connected to the output terminal 27 of the second inverter 62 in the memory circuit 60. The source of the drive transistor 31 is electrically connected to the high potential line 47. That is, the P-type drive transistor 31 is arranged on the high potential side with respect to the light-emitting element 20.

The enable transistor 34 is an enable transistor that controls light emission of the light-emitting element 20. When the enable transistor 34 is turned into the ON-state, the light-emitting element 20 can emit light. As described later, in the present exemplary embodiment, the light-emitting element 20 emits light when an active signal is supplied as an enable signal to the enable line 44, the enable transistor 34 is turned into the ON-state, the output terminal 27 of the second inverter 62 reaches a potential corresponding to the emission state, and the drive transistor 31 is turned into the ON-state.

The gate of the enable transistor 34 is electrically connected to the enable line 44. The source of the enable transistor 34 is electrically connected to the drain of the drive transistor 31. The drain of the enable transistor 34 is electrically connected to the light-emitting element 20 (anode 21). In other words, the P-type enable transistor 34 is arranged on the high potential side with respect to the light-emitting element 20.

Here, the P-type transistor is arranged on the higher potential side than the light-emitting element 20. The P-type drive transistor 31 and the P-type enable transistor 34 are arranged with respect to the light-emitting element 20 in this way, thus both the transistors 31 and 34 can be operated almost linearly (hereinafter simply described as be linearly operated). Therefore, the variation in the threshold voltages of the drive transistor 31 and the enable transistor 34 does not affect the display characteristics (emission luminance of the light-emitting element 20).

The source of the drive transistor 31 is electrically connected to the high potential line 47 and the source of the enable transistor 34 is electrically connected to the drain of the drive transistor 31, thus, the source potential of the drive transistor 31 is fixed to the high potential VDD, and the source potential of the enable transistor 34 is also substantially fixed to a value very close to the high potential VDD by linearly operating the drive transistor 31. In this way, even when the drive transistor 31 and the enable transistor 34 have a small source-drain voltage, electric conductivity of the drive transistor 31 and the enable transistor 34 being in the ON-state can be increased. As a result, most of the potential difference between the high potential VDD and the second low potential VSS2 (V4) is supplied to the light-emitting element 20, thus, it is less likely to be affected by variations in the threshold voltage of the drive transistor 31 and the enable transistor 34, and the uniformity of the emission luminance of the light-emitting element 20 among the pixels 59 (the sub-pixels 58) can be improved.

The selection transistor 32 is arranged between the memory circuit 60 and the data line 43. One of the source and the drain of the P-type selection transistor 32 is electrically connected to the data line 43, and the other is electrically connected to the input terminal 25 of the first inverter 61, that is, the gate of the transistor 35 and the transistor 37. The gate of the selection transistor 32 is electrically connected to the first scan line 42.

The selection transistor 32 is a selection transistor for the pixel circuit 41. The selection transistor 32 switches an ON-state and an OFF-state according to a scan signal (selection signal or non-selection signal) supplied to the first scan line 42. When the selection transistor 32 turns to the ON-state, the data line 43 and the input terminal 25 of the first inverter 61 of the memory circuit 60 become conductive, and the image signal supplied from the data line 43 is written to the memory circuit 60.

The maintain transistor 33 is arranged between the input terminal 25 of the first inverter 61 and the output terminal 27 of the second inverter 62. One of the source and the drain of the P-type maintain transistor 33 is electrically connected to the input terminal 25 of the first inverter 61 (the gate of the transistor 35 and the transistor 37), and the other is electrically connected to the output terminal 27 of the second inverter 62 (the drain of the transistor 36 and the transistor 38). The gate of the maintain transistor 33 is electrically connected to the second scan line 45.

The maintain transistor 33 switches the ON-state and the OFF-state according to a second scan signal (maintain signal or non-maintain signal) supplied to the second scan line 45. When the maintain transistor 33 turns to the ON-state, the output terminal 27 of the second inverter 62 and the input terminal 25 of the first inverter 61 are turned into a conductive state, and the image signal written to the memory circuit 60 is maintained between the first inverter 61 and the second inverter 62.

The selection transistor 32 and the maintain transistor 33 are the same conductivity type (P-type). The selection transistor 32 and the maintain transistor 33 operate substantially complementary to each other according to the scan signal supplied to the first scan line 42 and the second scan signal supplied to the second scan line 45. To be complementary to each other means that, the maintain transistor 33 is in the OFF-state when the selection transistor 32 is in the ON-state, and the maintain transistor 33 is in the ON-state when the selection transistor 32 is in the OFF-state. To be substantially complementary to each other means that, when the selection transistor 32 changes from the OFF-state to the ON-state, the maintain transistor 33 is already in the OFF-state or changes from the ON-state to the OFF-state. In other words, the maintain transistor 33 is not in the ON-state when the selection transistor 32 turns to the ON-state.

In the pixel circuit 41 according to Example 1, a method of controlling the selection transistor 32, the maintain transistor 33, and the enable transistor 34 to write (or rewrite) an image signal to the memory circuit 60 and to enable emission and non-emission of the light-emitting element 20 will be described below.

In Example 1, the first scan line 42, the second scan line 45, and the enable line 44 are mutually independent with respect to each pixel circuit 41, thus the selection transistor 32, the maintain transistor 33, and the enable transistor 34 can operate independently from each other. Then, the selection transistor 32 and the maintain transistor 33 perform operations substantially complementary to each other. As a result, the maintain transistor 33 can be not in the ON-state when the selection transistor 32 turns to the ON-state. Further, the enable transistor 34 can be always in the OFF-state when the selection transistor 32 turns to the ON-state.

When the image signal is written (or rewritten) to the memory circuit 60, the enable transistor 34 turns to the OFF-state by the non-active signal. As the selection transistor 32 turns to the ON-state by the selection signal, the image signal is supplied to the memory circuit 60 (the first inverter 61 and the second inverter 62). The image signal is written from the data line 43 to the first inverter 61 and from the first inverter 61 to the second inverter 62.

When the selection transistor 32 changes from the OFF-state to the ON-state, the maintain transistor 33 is already in the OFF-state or changes from the ON-state to the OFF-state by the non-maintain signal of the second scan signal. Therefore, when the selection transistor 32 turns to the ON-state, the maintain transistor 33 is not in the ON-state, thus the electrical coupling between the output terminal 27 of the second inverter 62 and the input terminal 25 of the first inverter 61 is cut off.

To understand the present invention clearly, we consider an imaginary circuit, in which the maintain transistor 33 does not exist and therefore the output terminal 27 of the second inverter 62 is always connented to the input terminal 25 of the first inverter 61. When the input terminal 25 of the first inverter 61 in the imaginary circuit is rewritten from Low (VSS1) to High (VDD), before a High signal is introduced to the input terminal 25 of the first inverter 61, its potential was Low, the potential of the input terminal 28 of the second inverter 62 was High, and the transistor 38 was in the ON-state. Therefore, as the selection transistor 32 in the imaginary circuit turns to the ON-state and the High signal (VDD) is supplied from the data line 43, electric current flows from the data line 43 (VDD) to the low potential line 46 (VSS1) via the selection transistor 32 and the transistor 38. This may cause an operational failure in the imaginary circuit that it takes undesirably a long time to rewrite the potential of the input terminal 25 from Low to High or that the potential is not rewritten.

We also consider another malfunction of the imaginary circuit where the maintain transistor 33 does not exist. When the input terminal 25 of the first inverter 61 in the imaginary circuit is rewritten from High to Low, before the Low signal is introduced to the input terminal 25 of the first inverter 61 the input terminal 28 of the second inverter 62 is Low and the transistor 36 was in the ON-state. Then, when the selection transistor 32 turns to the ON-state and the Low signal is supplied from the data line 43, electric current flows from the high potential line 47 to the data line 43, to which VSS is supplied at the current situation, through the transistor 36 and the selection transistor 32. This may cause an opperational failure in the imaginary circuit that it takes undesirably a long time to rewrite the potential of the input terminal 25 from High to Low, or that the potential is not rewritten.

In Example 1, when the selection transistor 32 turns to the ON-state and the image signal is written (or rewritten) to the memory circuit 60, the maintain transistor 33 arranged between the input terminal 25 of the first inverter 61 and the output terminal 27 of the second inverter 62 is in the OFF-state, and the electrical coupling between the input terminal 25 and the output terminal 27 is cut off, so that the problems described above can be suppressed.

Further, while the selection transistor 32 is in the ON-state, the enable transistor 34 is in the OFF-state, thus, the light-emitting element 20 does not emit light while the image signal is written to the memory circuit 60. In short, the path from the high potential line 47 to the low potential line 46 via the light-emitting element 20 and the drive transistor 31 is cut off by the enable transistor 34. Accordingly, when the image signal is written (or rewritten) to the memory circuit 60, the light-emitting element 20 stops emitting light, thus, the influence of the emission of the light-emitting element 20 during this period can be avoided, and an accurate gray scale can be expressed even in the display period P2-1 of SF1 for an extremely short period.

Note that, when the image signal is written (or rewritten) to the memory circuit 60, the image signal is written from the data line 43 to the first inverter 61, and an inverted signal (complementary signal) of the image signal is written from the first inverter 61 to the second inverter 62. Therefore, in parallel with writing the image signal from the data line 43 to the first inverter 61, a complementary data line for supplying the complementary signal and a complementary transistor with respect to the selection transistor 32 are not required, as compared with a case where an image signal (complementary signal) complementing the signal supplied to the data line 43 is written from the complementary data line to the second inverter 62. Therefore, as compared with the configuration including the complementary data line and the complementary transistor, it is easy to miniaturize the pixels 59 to achieve higher resolution, and it is not necessary to increase the number of wirings, so that the manufacturing yield can be improved. Further, as described in detail later, in the configuration of the present exemplary embodiment, in parallel with writing the image signal from the data line 43 to the first inverter 61, there is no current path from the data line 43 to the power supply line (the high potential line 47 or the low potential line 46) at the time of writing the image signal, so that the image signal can be rewritten at high speed with low power consumption, as compared with a case where an image signal (complementary signal) complementing the signal supplied to the data line 43 is written from the complementary data line to the second inverter 62.

When the selection transistor 32 is switched from the ON-state to the OFF-state by the non-selection signal, writing (or rewriting) of the image signal to the memory circuit 60 is stopped. According to the second scan signal, the maintain transistor 33 is already in the ON-state when the selection transistor 32 changes from the ON-state to the OFF-state, or changes from the OFF-state to the ON-state when the selection transistor 32 changes from the ON-state to the OFF-state.

Accordingly, the output terminal 27 of the second inverter 62 and the input terminal 25 of the first inverter 61 are electrically connected, and the image signal written to the memory circuit 60 is maintained between the first inverter 61 and the second inverter 62. The enable transistor 34 remains in the OFF-state and the light-emitting element 20 does not emit light until the active signal is supplied. The maintain signal is supplied to the second scan line 45 until the non-maintain signal of the next sub-field is input, thus the image signal stored in the memory circuit 60 can be stably held without being erroneously rewritten.

Subsequently, when the light-emitting element 20 emits light, the enable transistor 34 turns to the ON-state by the active signal while the selection transistor 32 is in the OFF-state (the maintain transistor 33 is in the ON-state). At this time, as the drive transistor 31 is in the ON-state by the image signal stored in the memory circuit 60, a current flows from the high potential line 47 to the low potential line 48 via the drive transistor 31, the enable transistor 34, and the light-emitting element 20, and the light-emitting element 20 emits light.

When the enable transistor 34 is in the ON-state, the selection transistor 32 is in the OFF-state and the maintain transistor 33 is in the ON-state, thus, the image signal stored in the memory circuit 60 is not maintained and rewritten while the light-emitting element 20 is emitting light. Thus, a high-quality image without any display errors can be achieved.

Potential Relationship

As described above, in the present exemplary embodiment, the low-voltage power supply is configured by the high potentials VDDG, VDDB, VDDR (V1G, V2B, and V5R) and the first low potential VSS1 (V3), and the high-voltage power supply is configured by the high potentials VDDG, VDDB, VDDR (V1G, V2B, and V5R) and the second low potential VSS2 (V4). Different high potentials VDDG, VDDB, and VDDR (V1G, V2B, and V5R) are supplied to the pixel circuits 41G, 41B, and 41R, and the first low potential VSS1 (V3) and the second low potential VSS2 (V4) are commonly supplied to the pixel circuits 41G, 41B, and 41R. With this configuration, the electro-optical device 10 which operates at high speed and obtains bright high-quality display can be achieved.

Figure 10:
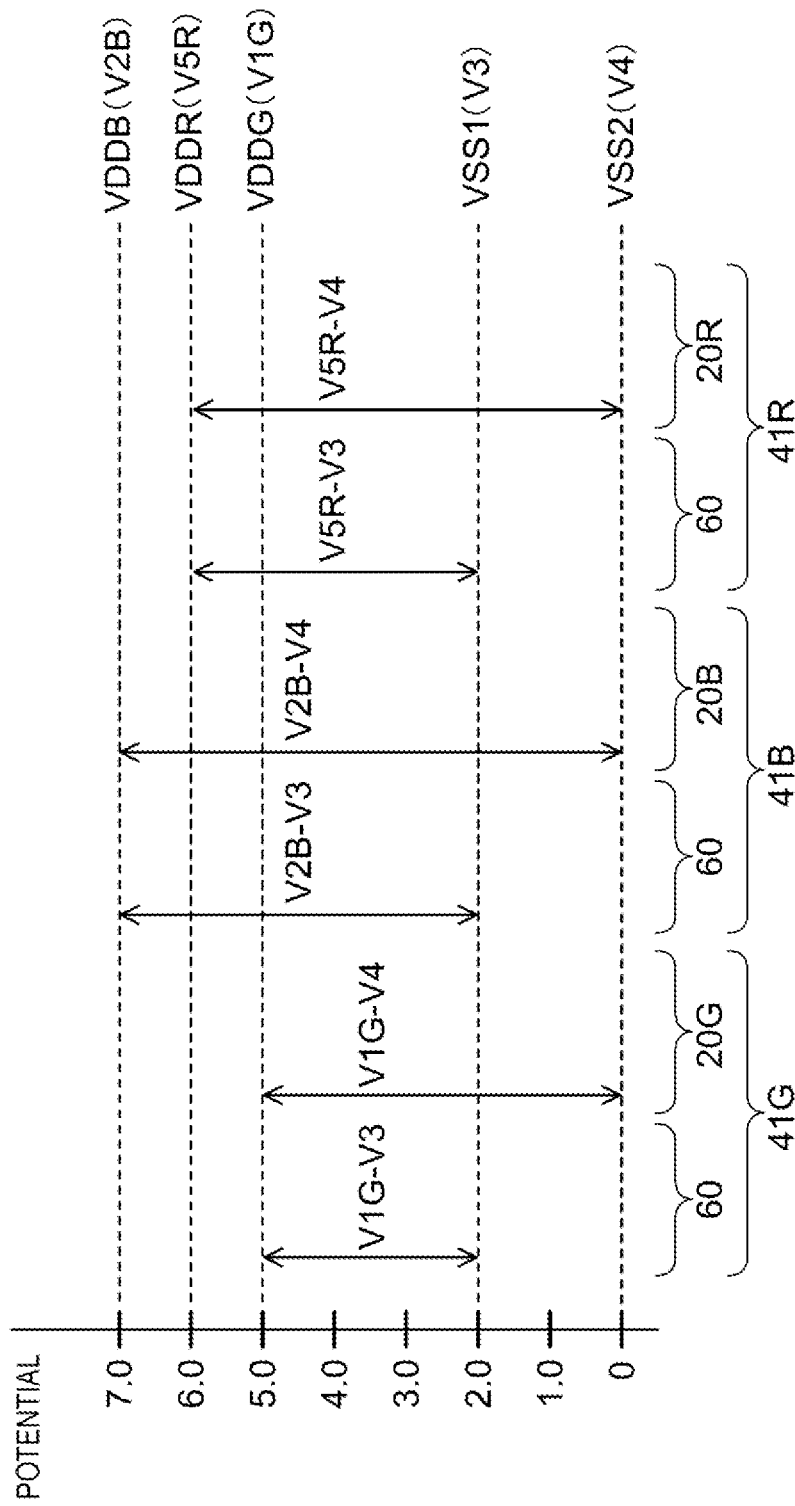
FIG. 10 illustrates a diagram for describing potential of the pixel circuit according to Example 1.

This point will be described below reference to FIG. 10. FIG. 10 is a diagram for describing the potential of the pixel circuit according to Example 1. In FIG. 10, the vertical axis represents an example of the potential in Example 1, and the horizontal axis represents the voltage of the low-voltage power supply applied to each of the memory circuits 60 of the pixel circuits 41G, 41B, and 41R and the voltage of the high-voltage power supply applied to the light-emitting element 20. In the following description, the first low potential is denoted as V3, the second low potential is denoted as V4, and the high potential is denoted as V1G, V2B and V5R.

As illustrated in FIG. 10, in the case of the pixel circuit 41G, the potential difference (V1G−V3=3.0 V) of the high potential (as an example, V1G=5.0 V) with respect to the first low potential (as an example, V3=2.0 V), which is the voltage of the low-voltage power supply, is lower than the potential difference (V1G−V4=5.0 V) of the high potential (for example, V1G=5.0 V) with respect to the second low potential (as an example, V4=0 V), which is the voltage of the high-voltage power supply. In the pixel circuit 41G, a voltage of V1G−V4=5.0 V is applied to the light-emitting element 20G, and a voltage of V1G−V3=3.0 V is applied to the memory circuit 60.

For the pixel circuit 41B, the potential difference (V2B−V3=5.0 V) of the high potential (as an example, V2B=7.0 V) with respect to the first low potential (as an example, V3=2.0 V), which is the voltage of the low-voltage power supply, is lower than the potential difference (V2B−V4=7.0 V) of the high potential (as an example, V2B=7.0 V) with respect to the second low potential (as an example, V4=0 V), which is the voltage of the high-voltage power supply. In the pixel circuit 41B, a voltage of V2B−V4=7.0 V is applied to the light-emitting element 20B, and a voltage of V2B−V3=5.0 V is applied to the memory circuit 60.

For the pixel circuit 41R, the potential difference (V5R−V3=4.0 V) of the high potential (as an example, V5R=6.0 V) with respect to the first low potential (as an example, V3=2.0 V), which is the voltage of the low-voltage power supply, is lower than the potential difference (V5R−V4=6.0 V) of the high potential (as an example, V5R=6.0 V) with respect to the second low potential (as an example, V4=0 V), which is the voltage of the high-voltage power supply. In the pixel circuit 41R, a voltage of V5B−V4=6.0 V is applied to the light-emitting element 20R, and a voltage of V5B−V3=4.0 V is applied to the memory circuit 60.

With each of the potentials being set as described above, the low-voltage power supply supplied with the first low potential V3 and the high potential V1G, V2B, and V5R causes the drive circuit 51 and the memory circuit 60 to operate, thus the transistors included in the drive circuit 51 and the memory circuit 60 can be miniaturized and operate at high speed. On the other hand, the high-voltage power supply supplied with the second low potential V4 and the high potential V1G, V2B, and V5R causes the light-emitting element 20 to emit light, and thus the emission luminance of the light-emitting element 20 can be increased. That is, the configuration of the present exemplary embodiment enables each of the circuits to operate at a high speed and can achieve the electro-optical device 10 in which the light-emitting element 20 emits light at high intensity to provide bright state.

The light-emitting element such as an organic EL element generally requires a relatively high voltage (for example, 5 V or higher) to emit light. However, in a semiconductor device, increasing the supply voltage necessitates increasing the size (gate length L and gate width W) of transistors in order to prevent operational failures, thus, the operation of circuits becomes slow. On the other hand, decreasing the supply voltage in order to operate circuits at high speeds leads to a decreased light emitting intensity of the light-emitting element. In short, in a typical configuration in which the supply voltage used for emission of the light-emitting element and the supply voltage used to operate circuits are identical, it is difficult to achieve both high light emitting intensity of the light-emitting element and high-speed operation of the circuits.

In contrast, the present exemplary embodiment has a low-voltage power supply and a high-voltage power supply as the power supplies for the electro-optical device 10 and a low-voltage power supply as the power supply for the operation of the drive circuit 51 and the memory circuit 60. In this way, the size of each of the transistors constituting the drive circuit 51 and the memory circuit 60 is set to be about L=0.5 μm and is smaller than L=0.75 μm of the drive transistor 31 and the enable transistor 34, and these circuits are driven at a low voltage of V1−V2=3.0 V. Thus, the drive circuit 51 and the memory circuit 60 can operate at a high speed.

Then, the high-voltage power supply causes the light-emitting element 20 to emit light at a high voltage from 5.0 V to 7.0 V, and thus the light-emitting element 20 can emit light with high luminance. Furthermore, as described later, the drive transistor 31 and the enable transistor 34 arranged in series to the light-emitting element 20 are linearly operated, and thus most of a high voltage from 5.0 V to 7.0 V can be applied to the light-emitting element 20, thus, the emission luminance of the light-emitting element 20 can be further enhanced.

As described above, in the present exemplary embodiment, the voltage of the high-voltage power supply for causing the light-emitting element 20G, the light-emitting element 20B, and the light-emitting element 20R to emit light are different from each other. The reason for this is as follows. In the present exemplary embodiment, the light-emitting unit 22G, the light-emitting unit 22B, and the light-emitting unit 22R are formed of light-emitting materials corresponding to mutually different colors. The characteristics of the emission luminance with respect to the voltage (hereinafter also referred to as voltage-emission luminance characteristics) are different among the light-emitting materials corresponding to different colors, hence it may be difficult to adjust the display color in the units of display of the pixels 59 including the sub-pixels 58G, 58B, and 58R. Different voltage-emission luminance characteristics mean that the characteristics of the current density with respect to the voltage of the light-emitting material and the emission luminance characteristics with respect to the current density are different.

Here, it is assumed that the voltage-emission luminance characteristics of the light-emitting unit 22R are lower than the voltage-emission luminance characteristics of the light-emitting unit 22G, and the voltage-emission luminance characteristics of the light-emitting unit 22B are lower than the voltage-emission luminance characteristics of the light-emitting unit 22R. In other words, in the case where the same emission luminance is desired for the light-emitting unit 22G, the light-emitting unit 22B, and the light-emitting unit 22R, it is necessary to make the voltage applied to the light-emitting element 20R greater than the voltage applied to the light-emitting element 20G and the voltage applied to the light-emitting element 20B greater than the voltage applied to the light-emitting element 20R.

Therefore, in the present exemplary embodiment, the high potentials V1G, V2B, and V5R to be supplied to the light-emitting element 20G, the light-emitting element 20B, and the light-emitting element 20R are different. Specifically, the voltage applied to the light-emitting element 20R is set to be V5R−V4=6.0 V, greater than the voltage applied to the light-emitting element 20G which is set to be V1G−V4=5.0 V, and the voltage applied to the light-emitting element 20B is set to be V2B−V4=7.0 V, greater than the voltage applied to the light-emitting element 20R. Thus, even in the case where the voltage-emission luminance characteristics differ depending on the light-emitting materials of the light-emitting units 22G, 22B, and 22R, by varying the voltages applied to the light-emitting elements 20G, 20B, and 20R according to the voltage-emission luminance characteristics, the emission luminance can be adjusted for each color. As a result, the display color in the units of display of the pixels 59 can be optimized.

Even in a case where the voltage-emission luminance characteristics are the same, the color balance may appear differently depending on the visibility of human eye. Further, in a case where the degree of decrease in the emission luminance with time is different depending on the light-emitting materials of the light-emitting units 22G, 22B, and 22R, even if the display color is initially properly adjusted in the units of display of the pixels 59, the initial adjusted color balance may change with time due to a decrease in emission luminance with time of the light-emitting material. As described above, even in the case where the color balance changes due to the decrease in the light emission luminance, by adjusting the voltage applied to the light-emitting elements 20G, 20B, and 20R, it is capable to optimize the color balance and to compensate the decrease in the luminance with time. This also means that the luminance of the image to be displayed can be adjusted without changing the number of gray scales of G, B, and R.

Note that, in the present exemplary embodiment, since the cathode 23 is formed as a common electrode in the light-emitting elements 20G, 20B, and 20R, the second low potential VSS2 (V4) supplied to the cathode 23 is common to the pixel circuits 41G, 41B, and 41R. Therefore, the high potentials VDDG, VDDB, and VDDR (V1G, V2B, V5R) supplied to the anodes 21G, 21B, and 21R of the light-emitting elements 20G, 20B, and 20R are made different for each of the pixel circuits 41G, 41B, and 41R, such that the voltages applied to the light-emitting elements 20G, 20B, and 20R are made different.

As a result, the magnitude of the current flowing through the light-emitting elements 20G, 20B, and 20R in the emission state are also different. Specifically, the current flowing from the high potential line 47R to the low potential line 48 via the light-emitting element 20R is greater than the current flowing from the high potential line 47G to the low potential line 48 via the light-emitting element 20G, and the current flowing from the high potential line 47B to the low potential line 48 via the light-emitting element 20B is greater. Since the current flowing through the high potential lines 47G, 47B, and 47R are different from the common low potential line 48, the widths of the high potential lines 47G, 47B, and 47R may be different from each other. That is, the thickness of the high potential line 47G as the first wiring and the thickness of the high potential line 47B as the second wiring may be different from each other. In general, it is preferable that the width of the wiring is larger as the flowing current is greater. Therefore, the higher potential line 47R is preferably thicker than the high potential line 47G, and the higher potential line 47B is preferably thicker than the high potential line 47R.

As illustrated in FIG. 6, in the present exemplary embodiment, the width W5*b* of the branch line 47Rb of the high potential line 47R is larger than the width W1*b* of the branch line 47Gb of the high potential line 47G, and the width W2*b* of the branch line 47Bb of the high potential line 47B is larger than the width W5*b* of the branch line 47Rb of the high potential line 47R. For example, the width W1*b* of the branch line 47Gb of the high potential line 47G is about 0.8 μm, the width W5*b* of the branch line 47Rb of the high potential line 47R is about 1.0 μm, and the width W2*b* of the branch line 47Bb of the high potential line 47B is about 1.2 μm. Further, the width W1*a* of the main line 47Ga of the high potential line 47G is about 200 μm, the width W5*a* of the main line 47Ra of the high potential line 47R is about 300 μm, and the width W2*a* of the main line 47Ba of the high potential line 47B is about 250 μm.

On the other hand, to the low potential line 48, a current passing through the light-emitting element 20G from the high potential line 47G, a current passing through the light-emitting element 20B from the high potential line 47B, and a current passing through the light-emitting element 20R from the high potential line 47R flow, thus the thickness of the high potential line 47G, B and R may be different from the thickness of the low potential line 48. Specifically, the width W4$b$ of the branch line 48$b$ of the low potential line 48 is preferably larger than the widths W1$b$, W2$b$, W5$b$ of the branch lines 47Gb, 47Bb, and 47Rb of the high potential lines 47G, B, and R, and the width W4$a$ of the main line 48$a$ of the low potential line 48 is preferably larger than the widths W1$a$, W2$a$, W5$a$ of the high potential lines 47G, B, and R, respectively. That is, it is preferable that a part (main line 47Ga) of the high potential line 47G as the first wiring and a part (main line 47Ba) of the high potential line 47B as the second wiring are thinner than the main line 48$a$ of the low potential line 48 as the fourth wiring. The width W4$b$ of the branch line 48$b$ of the low potential line 48 is, for example, about 1.0 μm, and the width W4$a$ of the main line 48$a$ of the low potential line 48 is, for example, about 750 μm.

In the present exemplary embodiment, the width W3$b$ of the branch line 46$b$ of the low potential line 46 is the same as the width W4$b$ of the branch line 48$b$ of the low potential line 48 (for example, about 1.0 μm). The width W3$a$ of the main line 46$a$ of the low potential line 46 is preferably larger than any of the widths W1$a$, W2$a$, W5$a$ of the main lines 47Ga, 47Ba, 47Ra of the high potential line 47G, B, R, but may be thinner than the width W4$a$ of the main line 48$a$ of the low potential line 48. In the present exemplary embodiment, the width W3$a$ of the main line 46$a$ of the low potential line 46 is, for example, about 500 μm.

Subsequently, in the present exemplary embodiment, the voltages of the low-voltage power supply for operating the memory circuit 60 also differ in the pixel circuits 41G, 41B, and 41R. Specifically, the voltage applied to the memory circuit 60 in the pixel circuit 41G is V1G−V3=5.0−2.0=3.0 V, and the voltage applied to the memory circuit 60 in the pixel circuit 41B is V2B−V3=7.0−2.0=5.0 V, and the voltage applied to the memory circuit 60 in the pixel circuit 41R is V5R−V3=6.0−2.0=4.0 V.

As described above, in each of the pixel circuits 41G, 41B and 41R, when the enable transistor 34 is in the ON-state, as the image signal output from the output terminal 27 of the second inverter 62 to the gate of the drive transistor 31 becomes Low, the drive transistor 31 turns to the ON-state and the light-emitting elements 20G, 20B, and 20R emit light. When the image signal output from the output terminal 27 of the second inverter 62 to the gate of the drive transistor 31 becomes High, the drive transistor 31 turns to the OFF-state and the light-emitting elements 20G, 20B, 20R do not emit light.

In order to reliably make the light-emitting elements 20G, 20B, and 20R to be surely in emission state when they should emit light, or make the light-emitting elements 20G, 20B, and 20R to be surely in non-emission-state when they should not emit light according to the image signal, in each of the pixel circuits 41G, 41B, and 41R, the potential of the Low image signal output to the gate of the drive transistor 31 needs to be set lower than the logic inversion voltage of the second inverter 62, and the potential of the High image signal needs to be set higher than the logic inversion voltage of the second inverter 62. The logic inversion voltage of the second inverter 62 may be the center potential of the high potential (V1G, B, R) and the low potential (V3) supplied to the second inverter 62.

In the pixel circuit 41G, according to the logic inversion potential being (V1G+V3)/2=(5.0 V+2.0 V)/2=3.5 V, while the High of the image signal is sufficiently high as V1G=5.0 V, the Low of the image signal is sufficiently low as V3=2.0 V. In the pixel circuit 41B, according to the logic inversion potential being (V2B+V3)/2=(7.0 V+2.0 V)/2=4.5 V, while the High of the image signal is sufficiently high as V2B=7.0 V, the Low of the image signal is sufficiently low as V3=2.0 V. In the pixel circuit 41R, according to the logic inversion potential being (V5R+V3)/2=(6.0 V+2.0 V)/2=4.0 V, while the High of the image signal is sufficiently high as V5R=6.0 V, the Low of the image signal is sufficiently low as V3=2.0 V. Thus, the digital signal of Low is lower than the mean potential of the first and third potentials. Also, the digital signal of High is higher than the mean potential of the second and third potentials. In the present exemplary embodiment, the potentials of image signals are different among the pixel circuits 41G, 41B, and 41R. However, if the above conditions are satisfied, the image signal can be set common to all these pixel circuits 41. That is, a potential lower than the central value between the first potential and the third potential is supplied as the Low signal, which is common to all the pixel circuits 41. An example of the Low signal is the third potential, namely Low=V3=2.0 V. Also a potential higher than the central value between the second potential and the third potential is supplied as the High signal, which is common to all the pixel circuits 41. An example of the High signal is the second potential, namely High=V2=7.0 V. As a result, in each of the pixel circuits 41G, 41B, and 41R, it is capable to reliably make the light-emitting elements 20G, 20B, and 20R to be surely in emission state when they should emit light, or make the light-emitting elements 20G, 20B, and 20R to be surely in non-emission state when they should not emit light according to the image signal.

Driving Method of Pixel Circuit

Figure 11:
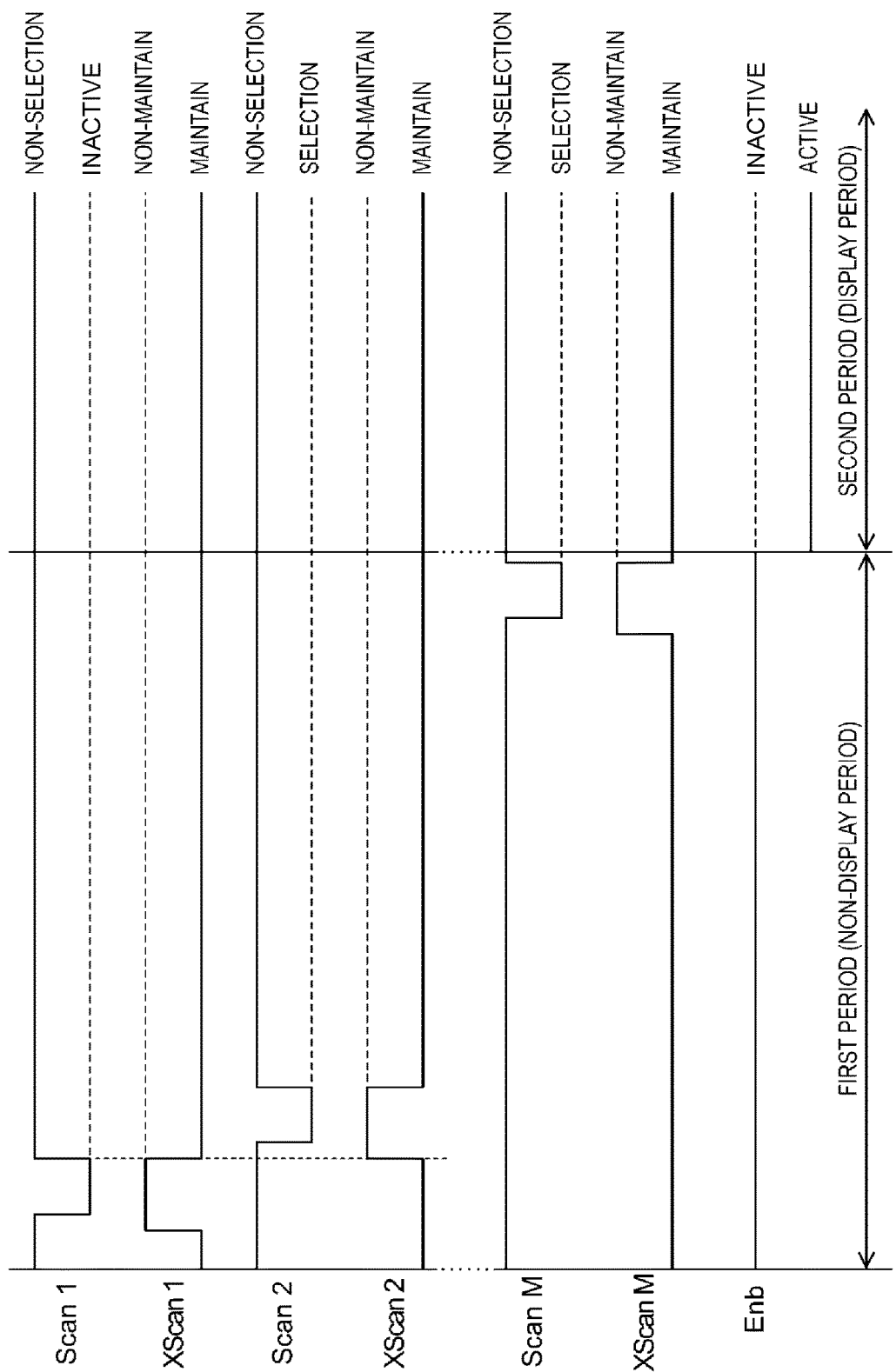
FIG. 11 illustrates a diagram for describing an example of a driving method of a pixel circuit according to the present exemplary embodiment.

Next, a driving method of the pixel circuit in the electro-optical device 10 according to the present exemplary embodiment will be described with reference to FIG. 11. FIG. 11 illustrates a diagram for describing the driving method of the pixel circuit as an example according to the present exemplary embodiment. In FIG. 11, the horizontal axis is the time axis and includes a first period (non-display period) and a second period (display period). The first period corresponds to P1 (P1-1 to P1-8) illustrated in FIG. 8. The second period corresponds to P2 (P2-1 to P2-8) illustrated in FIG. 8.

In the vertical axis in FIG. 11, Scan 1 to Scan M represent scan signals supplied to each of the first scan lines 42 respectively from the first row to the M-th row of the M first scan lines 42 (see FIG. 5). The scan signal includes a scan signal (selection signal) in a selection-state and a scan signal (non-selection signal) in a non-selection-state. Therefore, XScan 1 to XScan M represent second scan signals supplied to each of the second scan lines 42 respectively from the first row to the M-th row of the M second scan lines 42 (see FIG. 5). The second scan signal includes a second scan signal (maintain signal) in a selection-state and a second scan signal (non-maintain signal) in a non-selection-state. Enb represents an enable signal supplied to the enable line 44 (see FIG. 5). The enable signal includes an enable signal in an active-state (active signal) and an enable signal in a non-active-state (non-active signal).

As described with reference to FIG. 8, the single field (F) during which a single image is displayed is divided into a plurality of sub-fields (SFs), and each of the sub-fields (SFs) includes the first period (non-display period) and the second period (display period) that starts immediately after the end of the first period. The first period (non-display period) is a signal-writing period during which an image signal is written to the memory circuit 60 (see FIG. 9) in each of the pixel circuits 41 (see FIG. 5) located in the display region E. The second period (display period) is a period during which the light-emitting element 20 (see FIG. 9) can emit light in each of the pixel circuits 41 located in the display region E.

As illustrated in FIG. 11, in the electro-optical device 10 according to the present exemplary embodiment, a non-active signal is supplied as the enable signal to all of the enable lines 44 during the first period (non-display period). When the non-active signal is supplied to the enable lines 44, the enable transistors 34 (see FIG. 9) are turned into the OFF-state, and the light-emitting elements 20 in all of the pixel circuits 41 located in the display region E are then turned into non-emission state.

During the first period in each of the sub-fields (SF), the selection signal (High) is supplied as the scan signal to any of the first scan lines 42. When the selection signal is supplied to the first scan line 42, the selection transistor 32 (see FIG. 8) in the selected pixel circuit 41 is turned into the ON-state. In this way, an image signal is written to the first inverter 61 from the data line 43 (see FIG. 9) and to the second inverter 62 from the first inverter 61 in the selected pixel circuit 41. In this way, the image signal is written to and stored in the memory circuit 60 in each pixel circuit 41 during the first period.

Further, in Example 1, during the first period in each subfield (SF), the maintain signal (High) is supplied as the second scan signal to the second scan line 45, and the non-maintain signal (Low) is supplied as the second scan signal to the selected pixel circuit 41 by supplying the selection signal to the first scan line 42. The pulse width of the selection signal is the same as the pulse width of the non-maintain signal, but the timing at which the selection signal is supplied and the timing at which the non-maintain signal is supplied are different. That is, the non-maintain signal is supplied to the second scan line 45 before the selection signal is supplied to the first scan line 42 with respect to the selected pixel circuit 41.

Therefore, in the pixel circuit 41 selected by the selection signal, the maintain transistor 33 (see FIG. 9) changes from the ON-state to the OFF-state by the non-maintain signal before the selection transistor 32 changes from the OFF-state to the ON-state. As a result, the electrical coupling between the output terminal 27 of the second inverter 62 and the input terminal 25 of the first inverter 61 is cut off, so that in the pixel circuit 41 selected by the selection signal, writing (or rewriting) of image signals can be reliably and rapidly performed.

Note that, it is assumed that the selection signal is not supplied to the first scan line 42 before the non-maintain signal is supplied to the second scan line 45. If the selection transistor 32 turns to the ON-state while the maintain transistor 33 is in the ON-state, the output terminal 27 of the second inverter 62 and the input terminal 25 of the first inverter 61 are in an electrically connected state, that is, the same state as in the case where the maintain transistor 33 does not exist. Therefore, there is a possibility that a problem will occur that, it takes time to rewrite the potential of the input terminal 25 from High to Low, or it cannot be rewritten.

When writing (or rewriting) of the image signal into the memory circuit 60 is completed, the non-selection signal (Low) is supplied to the first scan line 42 with respect to the selected pixel circuit 41. In Example 1, the maintain signal (High) is supplied to the second scan line 45 before the non-selection signal is supplied to the first scan line 42 with respect to the selected pixel circuit 41. Therefore, in the pixel circuit 41 selected by the selection signal, the maintain transistor 33 changes from the OFF-state to the ON-state before the selection transistor 32 changes from the ON-state to the OFF-state. As a result, in the selected pixel circuit 41, the output terminal 27 of the second inverter 62 and the input terminal 25 of the first inverter 61 are electrically connected, and the image signal written to the memory circuit 60 is maintained between the first inverter 61 and the second inverter 62.

During the second period (display period), an active signal is supplied as the enable signal to all of the enable lines 44. When the active signal is supplied to each enable line 44, the enable transistors 34 turns to the ON-state, thus allowing each of the light-emitting elements 20 in all of the pixel circuits 41 located in the display region E to emit light. During the second period, the non-selection signal that makes each selection transistor 32 be in the OFF-state is supplied as the scan signal to all of the first scan lines 42. In this way, an image signal written in the subfield (SF) is maintained in the memory circuit 60 of each of the pixel circuits 41.

As described above, the first period (non-display period) and the second period (display period) can be controlled independently in the present exemplary embodiment, such that gray-scale display by digital time-division driving can be achieved. In addition, as a result, the second period can be set to be shorter than the first period, and thus an image with a larger number of gray scales can be displayed.

Furthermore, the enable signal supplied to the enable lines 44 is shared among the plurality of pixel circuits 41, such that driving the electro-optical device 10 can be facilitated. Specifically, in a case of digital driving without the first period, highly complicated driving is required to make the light emission period shorter than one vertical period in which selection of all the first scan lines 42 is completed. In contrast, in the present exemplary embodiment, the enable signal supplied to the enable line 44 is shared among the plurality of pixel circuits 41. Thus, even when there is a sub-field (SF) for which the light emission period is shorter than one vertical period in which selection of all the first scan lines 42 is completed, the electro-optical device 10 can be readily driven by simply shortening the second period.

As described above, according to the configuration of the pixel circuit 41 according to the present exemplary embodiment, an electro-optical device 10 can be achieve which can display a high-resolution and high-quality image at low power consumption, and write (or re-write) the image signal to the memory at high speed with certainty, and obtaining a brighter and high-quality display.

EXAMPLE 2

Configuration of Pixel Circuit

Figure 12:
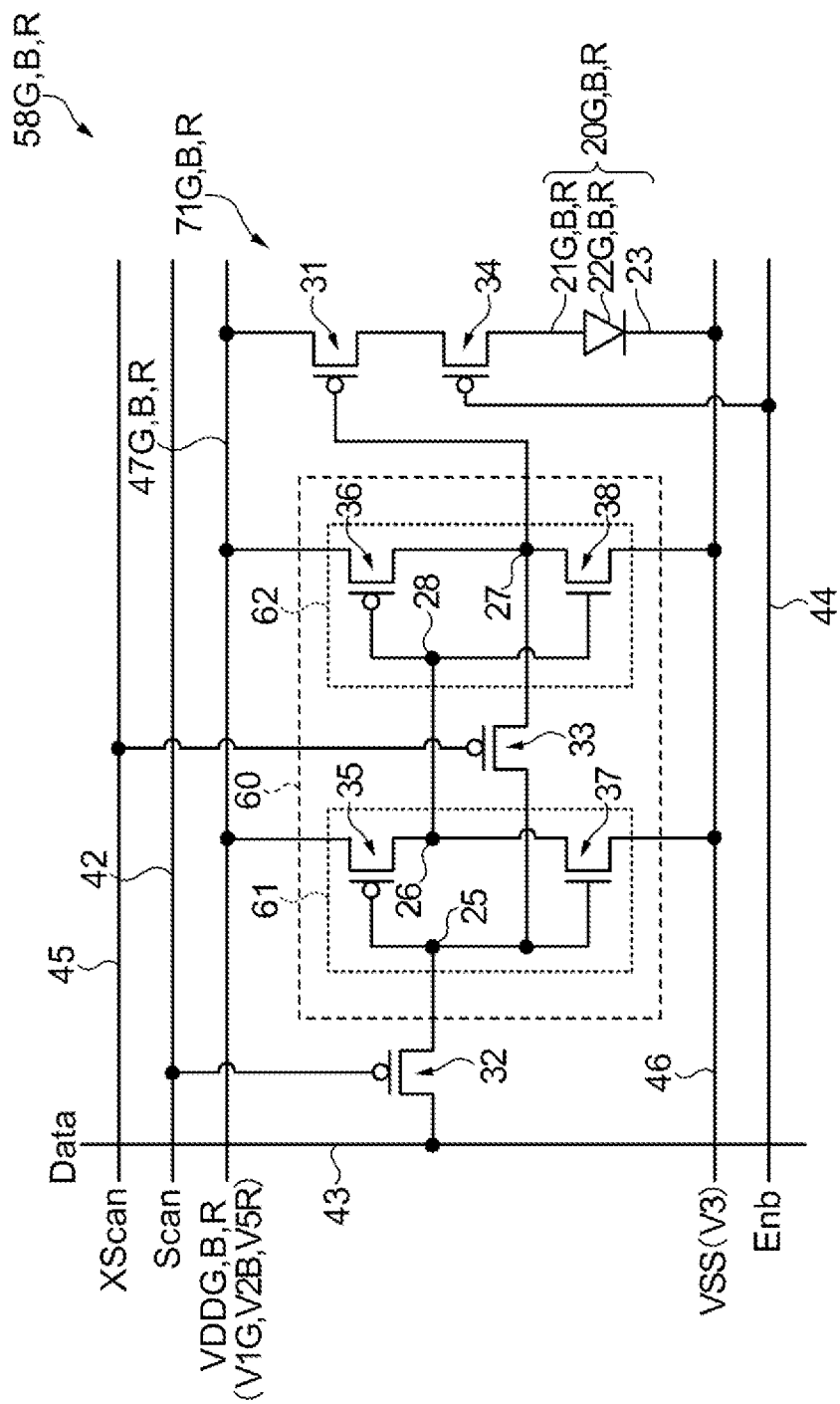
FIG. 12 illustrates a diagram for describing a configuration of a pixel circuit according to Example 2.
Figure 13:
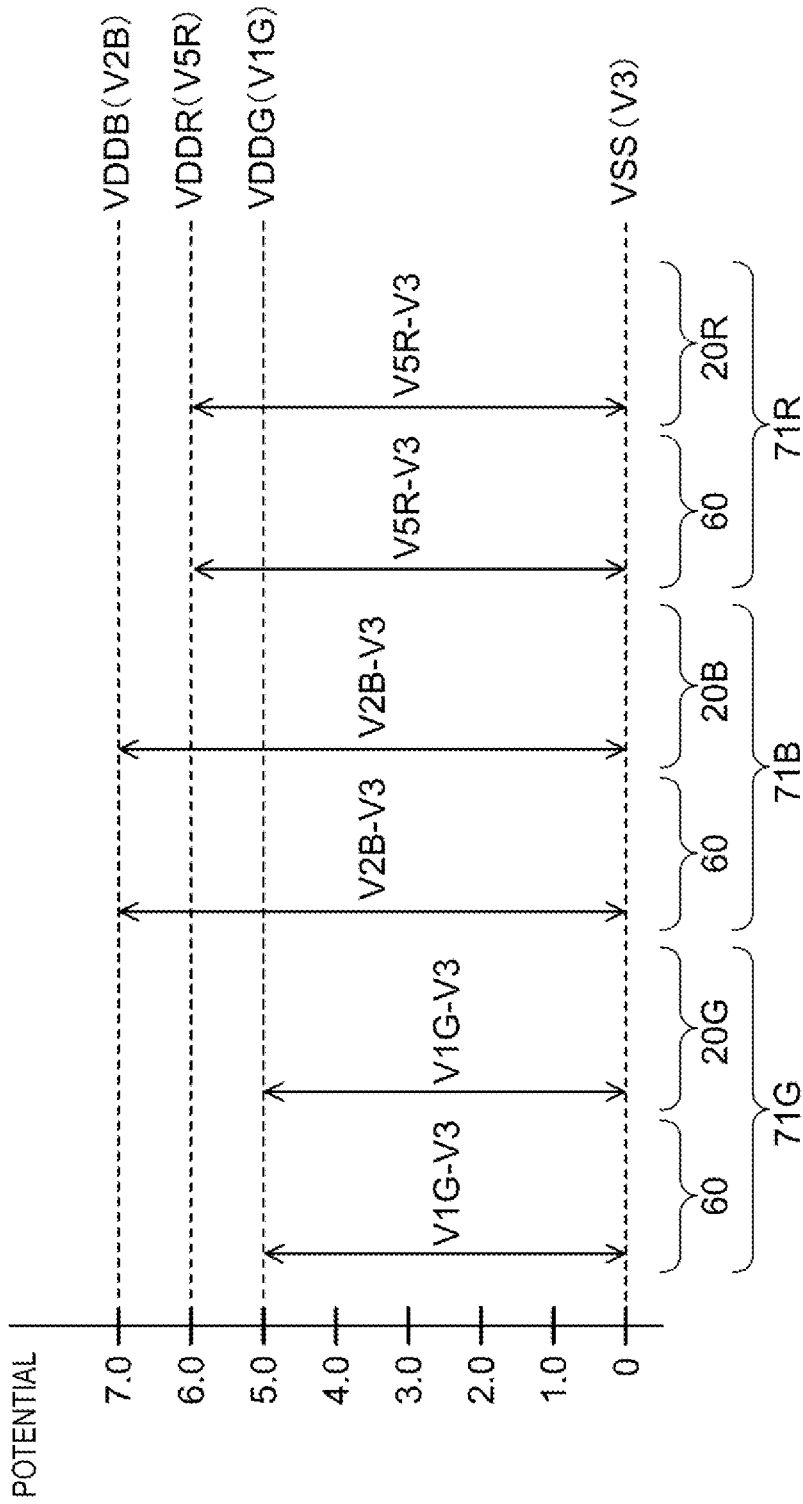
FIG. 13 illustrates a diagram for describing potential of the pixel circuit according to Example 2.
Figure 14:
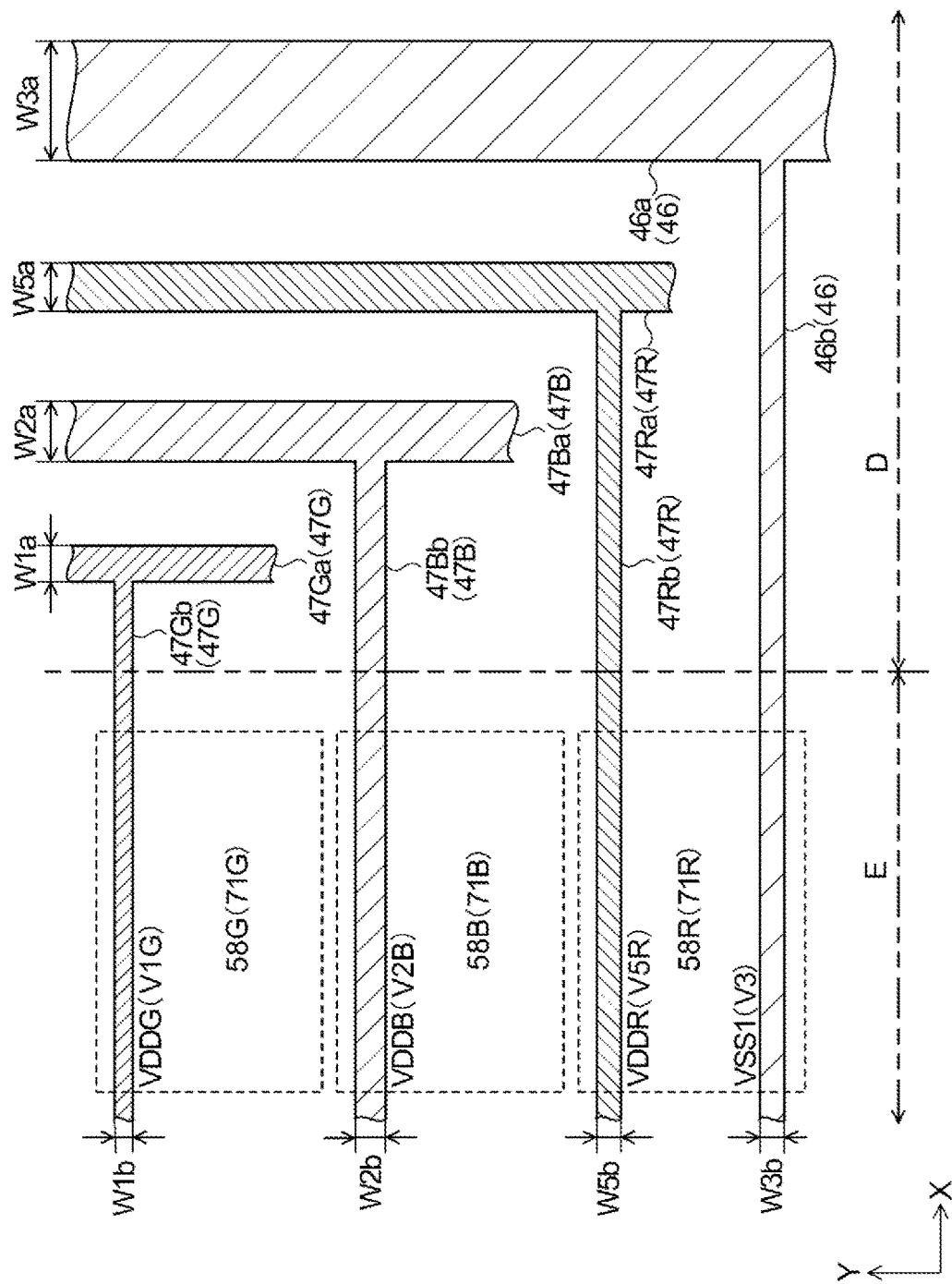
FIG. 14 illustrates a schematic diagram for describing wiring of an electro-optical device according to Example 2.

Subsequently, a configuration of a pixel circuit according to Example 2 is described below. FIG. 12 illustrates a diagram for describing the configuration of the pixel circuit according to Example 2. FIG. 13 is a diagram for describing potential of the pixel circuit according to Example 2. FIG. 14 is a schematic diagram for describing wiring of the electro-optical device according to Example 2. Note that, in the following description of Example 2, the differences from Example 1 will be described, the same components as those in Example 1 will be denoted by the same reference numerals in the drawings, and their description will be omitted. In the same way as in Example 1, G, B, R will be described with respect to different items in the pixel circuits 41G, 41B, 41R, and items common to the pixel circuits 41G, 41B, 41R will be described by omitting G, B, R.

As illustrated in FIG. 12, the pixel circuit 71 according to Example 2 includes a P-type drive transistor 31, a P-type enable transistor 34, a light-emitting element 20, a memory circuit 60, and a P-type selection transistor 32. The P-type maintain transistor 33 is arranged between the output terminal 27 of the second inverter 62 and the input terminal 25 of the first inverter 61 of the memory circuit 60.

The pixel circuit 71 according to Example 2 is different from the pixel circuit 41 according to Example 1 in which the low potential line 48 is not included, and the drive transistor 31, the enable transistor 34, and the light-emitting element 20 are arranged between the high potential line 47 and the low potential line 46 as in the memory circuit 60. That is, in the pixel circuit 71 according to Example 2, the voltage for causing the light-emitting element 20 to emit light and the voltage for operating the memory circuit 60 are the same.

For the sub-pixel 58G, the sub-pixel 58B, and the sub-pixel 58R, a pixel circuit 71G as a first pixel circuit is arranged in the sub-pixel 58G, a pixel circuit 71B as a second pixel circuit is arranged in the sub-pixel 58B, and the pixel circuit 71R is arranged in the sub-pixel 58R. The pixel circuit 71G includes a light-emitting element 20G as a first light-emitting element that emits G as a first color, the pixel circuit 71B includes a light-emitting element 20B as a second light-emitting element that emits B as a second color, and the pixel circuit 71R includes a light-emitting element 20R that emits R light.

In the non-display region D and the display region E, a high potential line 47G serving as a first wiring for supplying a first potential to the pixel circuit 71G, a high potential line 47B serving as a second wiring for supplying a second potential to the pixel circuit 71B, and a high potential line 47R for supplying a potential different from the first potential and the second potential to the pixel circuit 71R are arranged. In addition, a low potential line 46 as a third wiring for supplying a third potential to the pixel circuit 71G, the pixel circuit 71B, and the pixel circuit 71R is arranged.

The first potential (for example, V1G=VDDG=5.0 V) is supplied from the high potential line 47G to the pixel circuit 71G, the second potential (for example, V2B=VDDB=7.0 V) is supplied from the high potential line 47B to the pixel circuit 71B, and the fifth potential (for example, V5R=VDDR=6.0 V) is supplied from the high potential line 47R to the pixel circuit 71R. In addition, the third potential (for example, V3=VSS=0 V) is commonly supplied to the pixel circuits 71G, B, R from the low potential line 46.

As illustrated in FIG. 13, in the pixel circuit 71G, a voltage of V1G−V3=5.0 V−0 V=5.0 V is applied to the light-emitting element 20G and the memory circuit 60. In the pixel circuit 71B, a voltage of V2B−V3=7.0 V−0 V=7.0 V is applied to the light-emitting element 20B and the memory circuit 60. In the pixel circuit 71R, a voltage of V5R−V3=6.0 V−0 V=6.0 V is applied to the light-emitting element 20R and the memory circuit 60. Thus, in the pixel circuits 71 according to the second embodiment, the voltages applied to the light-emitting element 20G, the light-emitting element 20B, and the light-emitting element 20R are different, similarly to the pixel circuits 41 according to Example 1.

Note that, in the pixel circuits 71 according to Example 2, the cathode 23 as the common electrode of the light-emitting elements 20G, 20B, and 20R are electrically connected to the low potential line 46 as the third wiring, thus, the current from the high potential line 47G through the light-emitting element 20G, the current from the high potential line 47B through the light-emitting element 20B, and the current from the high potential line 47R through the light-emitting element 20R flow to the low potential line 46. Therefore, as illustrated in FIG. 14, the low potential line 46 is preferably thicker than the high potential lines 47G, B, and R. That is, a part (main line 47Ga) of the high potential line 47G as the first wiring and a part (main line 47Ba) of the high potential line 47B as the second wiring are preferably thinner than the low potential line 46 (main line 46a) as the third wiring. The width W3a of the main line 46a of the low potential line 46 is preferably larger than that of Example 1. In Example 2, the width W3a of the main line 46a of the low potential line 46 is, for example, about 750 μm.

The exemplary embodiments (Examples) described above merely represent one aspect of the present invention and any variation and application may be possible within the scope of the present invention. For example, the followings are modified examples.

Modified Example 1

In the pixel circuit 41 according to Example 1 described above, the cathode 23 is formed as a common electrode of the light-emitting elements 20G, 20B, and 20R, the low potential (VSS2) is commonly supplied from low potential line 48, three high potentials (VDDG, VDDB, VDDR) different from each other are supplied from the high potential lines 47G, 47B, and 47R, but the present invention is not limited to such an embodiment. The cathode 23 may be formed by patterning for each of the light-emitting elements 20G, 20B, and 20R. For example, this configuration can be realized in a micro LED display or the like in which fine LED elements as the light-emitting element 20 are arranged at high density.

Figure 15:
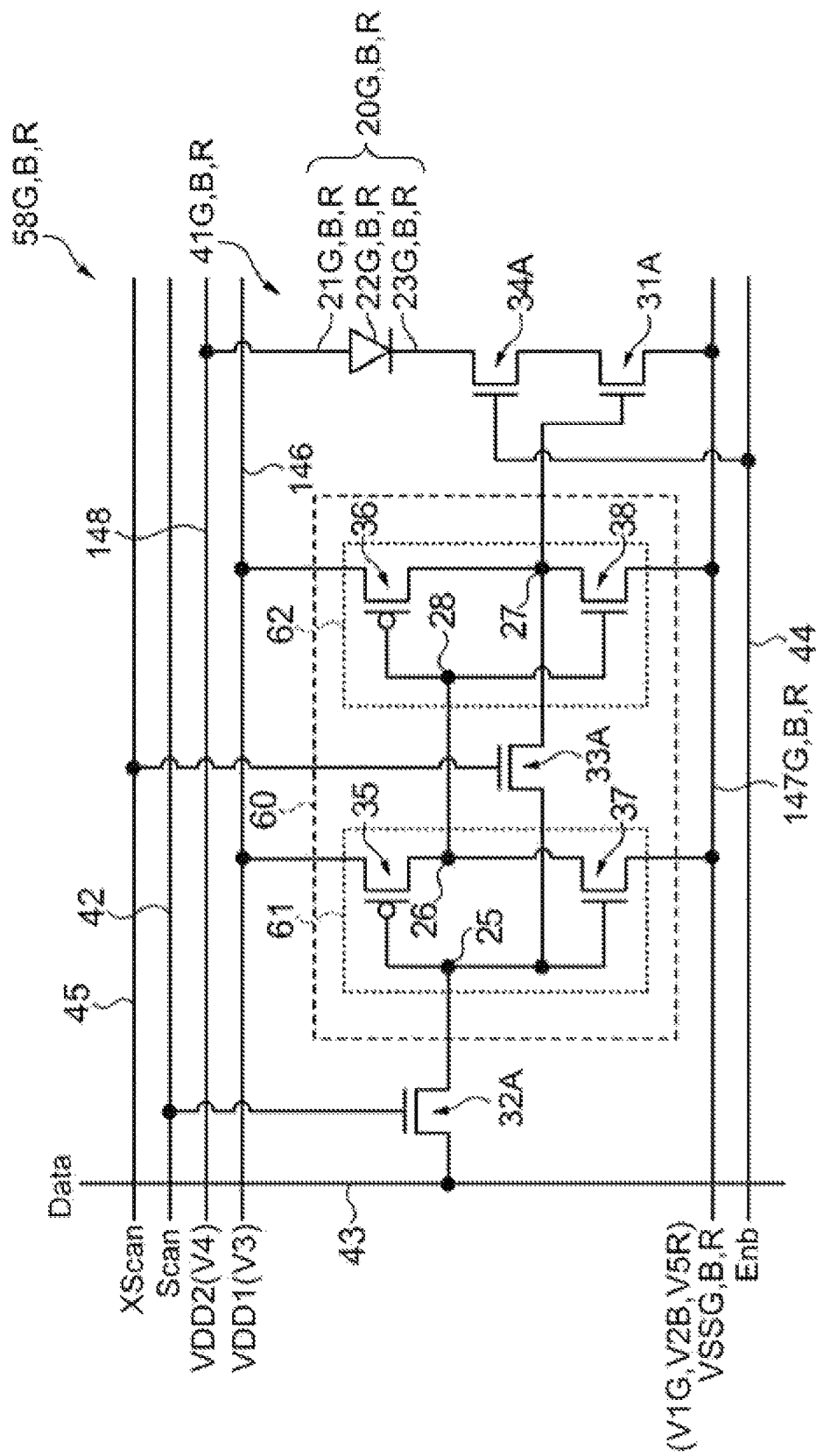
FIG. 15 illustrates a diagram for describing a configuration of a pixel circuit according to Modified Example 1.

FIG. 15 illustrates a diagram for describing the configuration of the pixel circuit according to Modified Example 1. In the case of the configuration of Modified Example 1, the low potentials (VSSG, VSSB, VSSR) different from each other are supplied from the three low potential lines to the light-emitting elements 20G, 20B, and 20R. The second high potential (VDD2) common to the sub-pixels 58G, 58B, and 58R are supplied from the high potential lines 148 to the light-emitting elements 20G, 20B, and 20R. The low potentials (VSSG, VSSB, VSSR) different from each other and the first high potential (VDD1), which is lower than the second high potential, are supplied to the memory circuits 60 from the three low potential lines and the high potential line 146, respectively. In a case of a configuration applied to Example 2, the low potentials (VSSG, VSSB, VSSR) different from each other are supplied to the memory circuits 60 and the light-emitting elements 20G, 20B, 20R from the three low potential lines. In addition, the first high potential (VDD1) common to the sub-pixels 58G, 58B, and 58R are supplied to the memory circuits 60 and the light-emitting elements 20G, 20B, 20R from the common high potential line.

In other words, the first potential (V1G=VSSG) is supplied to the pixel circuit 41G as the first pixel circuit from the low potential line 147G as the first wiring, the second potential (V2B=VSSB) is supplied to the pixel circuit 41B as the second pixel circuit from the low potential line 147B as the second wiring, and the fifth potential (V5R=VSSR) is supplied to the pixel circuit 41R as the third pixel circuit from the low potential line 147R as the fifth wiring. Then, the first high potential (V3=VDD1) as the third potential is supplied to the pixel circuit 41G, the pixel circuit 41B, and the pixel circuit 41R from the high potential line 146 as the third wiring. Also, the second high potential (V4=VDD2) as the second potential is supplied to the pixel circuit 41G, the pixel circuit 41B, and the pixel circuit 41R from the high potential line 148 as the fourth wiring. The first high potential (VDD1) as the third potential is higher than any of the first potential (VSSG), the second potential (VSSB), and the fifth potential (VSSR). The fourth potential is higher than the third potential is.

In the present Modified Example, the low potentials that are supplied to the pixel circuit 41G, the pixel circuit 41B, and the pixel circuit 41R are different from each other. Specifically, the first potential (V1G) supplied from the low potential line 147G to the pixel circuit 41G is a low potential VSSG (for example, V1G=VSSG=2.0 V), the second potential (V2B) supplied from the low potential line 147B to the pixel circuit 41B is a low potential VSSB (for example, V2B=VSSB=0 V), and the fifth potential (V5R) supplied from the low potential line 147R to the pixel circuit 41R is a low potential VSSR (for example, V5R=VSSR=1.0 V).

The first potential (V1G) supplied to the pixel circuit 41G, the second potential (V2B) supplied to the pixel circuit 41B, and the fifth potential (V5R) supplied to the pixel circuit 41R are respectively supplied from the low potential line 147G, the low potential line 147B, and the low potential line 147R, respectively, thus, they are mutually independent. In the present exemplary embodiment, the first potential (V1G), the second potential (V2B), and the fifth potential (V5R) supplied to the pixel circuits 41G, 41B, and 41R, respectively, are different from each other, but for example, two of them may be set to the same potential, and the remaining one may be set to a different potential.

The high potentials are common to the pixel circuit 41G, the pixel circuit 41B, and the pixel circuit 41R. Specifically, the third potential (V3) commonly supplied to the pixel circuits 41G, 41B, and 41R from the high potential line 146 is a first high potential VDD1 (for example, V3=VDD1=5.0 V), and the fourth potential (V4) commonly supplied to the pixel circuits 41G, 41B, and 41R from the high potential line 148 is a second high potential VDD2 (for example, V4=VDD2=7.0 V). The high potential line 146 and the high potential line 148 are provided independently from each other. Therefore, the third potential (V3) and the fourth potential (V4) are independent. The third potential (V3) is higher than the first potential (V1G), the second potential (V2B) and the fifth potential (V5R). The fourth potential (V4) is higher than the third potential (V3).

In the present Modified Example, a low-voltage power supply is configured by the first high potential VDD1 (V3) respectively with the low potential VSSG (V1G), the low potential VSSB (V2B), and the low potential VSSR (V5R), and a high-voltage power supply is configured by the second high potential VDD2 (V4) respectively with the low potential VSSG (V1G), the low potential VSSB (V2B), and the low potential VSSR (V5R). In each pixel circuit 41G, 41B, and 41R, each of the low potentials VSSG, VSSB, and VSSR is a reference potential for the low-voltage power supply and the high-voltage power supply.

The pixel circuit 41 according to the Modified Example 1 includes a N-type drive transistor 31A, a light-emitting element 20, a N-type enable transistor 34A, a memory circuit 60, and a N-type selection transistor 32A. The pixel circuit 41 includes the memory circuit 60, thus, the electro-optical device 10 is driven digitally. As a result, the variation in the emission luminance of the light-emitting element 20 among the sub-pixels 58 is suppressed as compared with the case of analog driving, and variation in display among the pixels 59 is reduced.

The pixel circuit 41G as the first pixel circuit includes a drive transistor 31A as a first transistor electrically connected in series to the light-emitting element 20G. The pixel circuit 41B as the second pixel circuit includes a drive transistor 31A as a second transistor electrically connected in series to the light-emitting element 20B. The pixel circuit 41R as the third pixel circuit includes a drive transistor 31A as a third transistor electrically connected in series to the light-emitting element 20R. The drive transistor 31A included in the pixel circuit 41G, the drive transistor 31A included in the pixel circuit 41B, and the drive transistor 31A included in the pixel circuit 41R are elements of the same conductivity type. The drive transistor 31A, the enable transistor 34A, and the light-emitting element 20 in the first pixel circuit are arranged in series between the first wiring (low potential line 147G) and the fourth wiring (high potential line 148). The drive transistor 31A, the enable transistor 34A, and the light-emitting element 20 in the second pixel circuit are arranged in series between the second wiring (low potential line 147B) and the fourth wiring (high potential line 148). The drive transistor 31A, the enable transistor 34A, and the light-emitting element 20 in the third pixel circuit are arranged in series between the fifth wiring (low potential line 147R) and the fourth wiring (high potential line 148).

The pixel circuit 41G as the first pixel circuit includes a memory circuit 60 as a first memory circuit. The pixel circuit 41B as the second pixel circuit includes a memory circuit 60 as a second memory circuit. The pixel circuit 41R as the third pixel circuit includes a memory circuit 60 as a third memory circuit. The memory circuit 60 included in the pixel circuit 41G, the memory circuit 60 included in the pixel circuit 41B, and the memory circuit 60 included in the pixel circuit 41R have the same configuration. The memory circuit 60 in the first pixel circuit is arranged between the first wiring (low potential line 147G) and the third wiring (high potential line 146). The memory circuit 60 in the second pixel circuit is arranged between the second wiring (low potential line 147B) and the third wiring (high potential line 146). The memory circuit 60 in the third pixel circuit is arranged between the fifth wiring (low potential line 147R) and the third wiring (high potential line 146). The selection transistor 32A is arranged between the memory circuit 60 and the data line 43.

In the present Modified Example, the voltages of the low-voltage power supply for operating the memory circuit 60 also differ in the pixel circuits 41G, 41B, and 41R. Specifically, the voltage applied to the memory circuit 60 in the pixel circuit 41G is V3−V1G=5.0−2.0=3.0 V, and the voltage applied to the memory circuit 60 in the pixel circuit 41B is V3−V2B=5.0−0=5.0 V, and the voltage applied to the memory circuit 60 in the pixel circuit 41R is V3−V5R=5.0−1.0=4.0 V.

In the pixel circuit 41G, according to the logic inversion potential being (V1G+V3)/2=(2.0 V+5.0 V)/2=3.5 V, while the High of the image signal is sufficiently high as V3=5.0 V, the Low of the image signal is sufficiently low as V1G=2.0 V. In the pixel circuit 41B, according to the logic inversion potential being (V2B+V3)/2=(0 V+5.0 V)/2=2.5 V, while the High of the image signal is sufficiently high as V3=5.0 V, the Low of the image signal is sufficiently low as V2B=0 V. In the pixel circuit 41R, according to the logic inversion potential being (V5R+V3)/2=(1.0 V+5.0 V)/2=3.0 V, while the High of the image signal is sufficiently high as V3=5.0 V, the Low of the image signal is sufficiently low as V5R=1.0 V. Thus, the digital signal of High is higher than the mean potential of the first and third potentials. Also, the digital signal of Low is lower than the mean potential of the second and third potentials. In the present Modified Example, the potentials of image signals are different among the pixel circuits 41G, 41B, and 41R. However, if the above conditions are satisfied, the image signal can be set common to all these pixel circuits 41. That is, a potential higher than the central value between the first potential and the third potential is supplied as the High signal, which is common to all the pixel circuits 41. An example of the High signal is the third potential, namely High=V3=5.0 V. Also, a potential lower than the central value between the second potential and the third potential is supplied as the Low signal, which is common to all the pixel circuits 41. An example of the Low signal is the second potential, namely Low=V2=0 V. As a result, in each of the pixel circuits 41G, 41B, and 41R, it is capable to reliably make the light-emitting elements 20G, 20B, and 20R to be surely in emission state when they should emit light, or make the light-emitting elements 20G, 20B, and 20R to be surely in non-emission state when they should not emit light according to the image signal.

In a case where the cathode 23 is formed by patterning for each of the light-emitting elements 20G, 20B, 20R, the drive transistor can be set to N-type and be arranged between the cathode 23 of the light-emitting elements 20G, 20B, 20R and the low potential line.

Modified Example 2

In the pixel circuits according to Example 1 or Example 2 described above, the pixel circuits 41G, 41B, 41R are respectively arranged along the X direction, and the high potential lines 47G, 47B, 47R extend in the X direction, but the invention is not limited to such an embodiment. The pixel circuits 41G, 41B, 41R may be respectively arranged along the Y direction, and the high potential lines 47G, 47B, 47R may extend along the Y direction. Further, in the pixel circuits according to Example 1 or Example 2 described above, the pixel circuits 41G, 41B, and 41R are respectively arranged along the X direction, and the light-emitting regions of the light-emitting elements 20G, 20B, and 20R extend in the X direction. But the pixel circuits 41G, 41B, and 41R may be arranged along the X direction, whereas the light-emitting regions of the light-emitting elements 20G, 20B, and 20R may extend along the Y direction.

Modified Example 3

In the pixel circuits according to Example 1 or Example 2 described above, the gate of the drive transistor 31 is electrically connected to the output terminal 27 of the second inverter 62, but the present invention is not limited to such an embodiment. The gate of the drive transistor 31 may be electrically connected to the input terminal 28 of the second inverter 62, that is, the output terminal 26 of the first inverter 61 and the input terminal 28 of the second inverter 62.

Modified Example 4

In the pixel circuits according to Example 1 or Example 2 described above, the memory circuit 60 includes the two inverters 61 and 62, but the present invention is not limited to such an embodiment. The memory circuit 60 may include an even number of two or more inverters.

Modified Example 5

In the above-described exemplary embodiments (Examples and Modification Examples), as the electro-optical device, the organic EL device in which the light-emitting elements 20 formed of organic EL elements are aligned in 720 rows×3840 (1280×3) columns on the element substrate 11 formed of a single crystal semiconductor substrate (single crystal silicon wafer) has been described by taking as an example, but the electro-optical device in the present invention is not limited to such constructions. For example, the electro-optical device may include a thin film transistor (TFT) as each transistor formed on the element substrate 11 formed of a glass substrate, or the electro-optical device may include a TFT on a flexible substrate formed of polyimide and the like. Further, the electro-optical device may be a quantum dot display using a nano-sized semiconductor crystal material in a light-emitting element. The electro-optical device may use, as a color filter, quantum dots that can convert incident light into light with a different wavelength.

Modified Example 6

While the electronic apparatus has been described in the above-described exemplary embodiments by taking as an example, the see-through head-mounted display 100 incorporating the electro-optical device 10, the electro-optical device 10 of the present invention is also applicable to other electronic apparatuses including a closed-type head-mounted display. Other types of electronic apparatus include, for example, projectors, rear-projection televisions, direct-viewing televisions, cell phones, portable audio devices, personal computers, video camera monitors, automotive navigation devices, head-up displays, pagers, electronic organizers, calculators, wearable devices such as wristwatches, handheld displays, word processors, workstations, video phones, POS terminals, digital still cameras, signage displays, and the like.

The content derived from this embodiment will be described below.

An electro-optical device according to an aspect of the present application includes a first pixel circuit, a second pixel circuit, a first wiring line supplying a first potential to the first pixel circuit, a second wiring line supplying a second potential to the second pixel circuit, and a third wiring line supplying a third potential to the first pixel circuit and the second pixel circuit, wherein the first circuit corresponding to a first color includes a first light-emitting element, the second pixel circuit corresponding to a second color that differs from the first color includes a second light-emitting element, the first potential and the second potential being mutually independent.

According to this configuration, irrespective of the first potential supplied to the first pixel circuit including the first light-emitting element that displays the first color, the second pixel circuit to be supplied to the second pixel circuit including the second light-emitting element that displays the second color can be set. Thereby, for example, in a case where the characteristics of the emission luminance with respect to the voltage are different between the light-emitting materials of the first light-emitting element and the second light-emitting element, or in a case where the color balance changes due to the deterioration speed being different depending on each light-emitting material, it is possible to adjust the emission luminance and the color balance by setting the first potential supplied to the first light-emitting element and the second potential supplied to the second light-emitting element.

In the electro-optical device described above, it is preferable that the first potential and the second potential are different from each other.

According to this configuration, in a case where the characteristics of the emission luminance with respect to the voltage are different between the light-emitting materials of the first light-emitting element and the second light-emitting element, or in a case where the color balance changes due to the deterioration speed being different depending on each light-emitting material, the emission luminance and the color balance can be adjusted by setting the first potential supplied to the first light-emitting element and the second potential supplied to the second light-emitting element.

In the electro-optical device described above, it is preferable that a terminal of the first light-emitting element is electrically connected to the first wiring line, and a terminal of the second light-emitting element is electrically connected to the second wiring line.

According to this configuration, the first potential is supplied from the first wiring to the terminal of the first light-emitting element and the second potential is supplied from the second wiring to the terminal of the second light-emitting element, thus the first potential and the second potential can be independent and different potentials.

In the electro-optical device described above, it is preferable that the first pixel circuit includes a first memory circuit, the second pixel circuit includes a second memory circuit, the first memory circuit is arranged between the first wiring and the third wiring, and the second memory circuit is arranged between the second wiring and the third wiring.

According to this configuration, the first pixel circuit includes the first memory circuit, the second pixel circuit includes the second memory circuit. The first light-emitting element emits light according to output of the first memory circuit and the second light-emitting element emits light according to output of the second memory circuit. Thus when the emission luminance characteristics with respect to the voltage are different between the light-emitting materials corresponding to different colors, the emission luminance can be adjusted for each color according to set the first voltage and the second voltage to the suitable voltage. Further when the initially adjusted color balance change with time due to the fact that the deterioration speed differs depending on each light-emitting material, the emission luminance can be adjusted for each color according to set the first voltage and the second voltage to the suitable voltage.

In the electro-optical device described above, it is preferable that the first memory circuit and the second memory circuit are configured to store a digital signal, that Low of the digital signal is lower than a center potential of the first potential and the third potential, and that High of the digital signal is higher than a center potential of the second potential and the third potential.

According to this configuration, when the voltage to be supplied to the first memory circuit differ from the voltage to be supplied to the second memory circuit, writing of the digital signals and storing the distal signals make enable in both of the first memory circuit and the second memory circuit. That is, the first memory circuit and the second memory circuit are able to operate as memory circuits accurately.

In the electro-optical device described above, it is preferable that the first pixel circuit includes a first transistor electrically connected in series to the first light-emitting element, the second pixel circuit includes a second transistor electrically connected in series to the second light-emitting element, and the third potential is lower than the first potential and the second potential.

According to this configuration, the first light-emitting element emits light when the first transistor is in the ON-state, and the second light-emitting element emits light when the second transistor is in the ON-state. In addition, the third potential commonly supplied to the first pixel circuit and the second pixel circuit is lower than the first potential and the second potential. Due to making the first potential and the second potential to be the high potential (VDD) different from the third potential which is the low potential (VSS), the voltage applied to the first light-emitting element and the voltage applied to the second light-emitting element can be made different from each other.

In the electro-optical device described above, it is preferable that the first potential is lower than the second potential.

According to this configuration, the first potential is lower than the second potential. Thus the voltage supplied to the second pixel circuit which is the potential difference between the second potential and the third potential, the second pixel circuit includes the second light-emitting element that emits the second color, makes higher than the voltage supplied to the first pixel circuit which is the potential difference between the first potential and the third potential, the first pixel circuit includes the first light-emitting element that emits the first color. Thus, even if the luminance of the second light-emitting element is lower than the luminance of the first light-emitting element when same voltage applied to the first light-emitting element and the second light-emitting element, it is possible to the luminance of the first light-emitting element makes same as the luminance of the second light-emitting element.

In the electro-optical device described above, it is preferable that the first memory circuit and the second memory circuit are configured to store a digital signal, that High of the digital signal is higher than a center potential of the first potential and the third potential, and that Low of the digital signal is lower than a center potential of the second potential and the third potential.

According to this configuration, even if the voltage supplied to the first memory circuit is different from the voltage supplied to the second memory circuit, both of the first memory circuit and the second memory circuit enable to be written digital signals and stored them correctly. That is, the first memory circuit and the second memory circuit are able to operate as memory circuits accurately.

In the electro-optical device described above, it is preferable that the first pixel circuit includes a first transistor that is electrically connected in series to the first light-emitting element, that the second pixel circuit includes a second transistor that is electrically connected in series to the second light-emitting element, and that the third potential is higher than the first potential and the second potential.

According to this configuration, the first light-emitting element emits light when the first transistor is in the ON-state, and the second light-emitting element emits light when the second transistor is in the ON-state. In addition, the third potential commonly supplied to the first pixel circuit and the second pixel circuit is higher than the first potential and the second potential. Due to making the first potential and the second potential to be the low potential (VSS) different from the third potential which is the high potential (VDD), the voltage applied to the first light-emitting element and the voltage applied to the second light-emitting element can be made different from each other.

In the electro-optical device described above, it is preferable that the first potential is higher than the second potential.

According to this configuration, the first potential is higher than the second potential. Thus the voltage supplied to the second pixel circuit which is the potential difference between the second potential and the third potential, the second pixel circuit includes the second light-emitting element that emits the second color, makes higher than a voltage supplied to the first pixel circuit which is the potential difference between the first potential and the third potential, the first pixel circuit includes the first light-emitting element that emits the first color. Thus, even if the luminance of the second light-emitting element is lower than the luminance of the first light-emitting element when same voltage applied to the first light-emitting element and the second light-emitting element, it is possible to the luminance of the first light-emitting element makes same as the luminance of the second light-emitting element.

In the electro-optical device described above, it is preferable that the first pixel circuit and the second pixel circuit are arranged along a first direction, and the first wiring and the second wiring extend along the first direction.

According to this configuration, the first wiring and the second wiring are arranged along the first direction in which the first pixel circuit and the second pixel circuit are arranged, thus, the first wiring and the second wiring can be easily arranged with respect to the first pixel circuit and the second pixel circuit.

In the electro-optical device described above, it is preferable that the first wiring and the second wiring are arranged in a display region in which the first pixel circuit and the second pixel circuit are arranged and at an outside of the display region, and the thickness of the first wiring and the thickness of the second wiring are different in the display region.

According to this configuration, the voltage applied to the first pixel circuit between the first wiring and the third wiring and the voltage applied to the second pixel circuit between the second wiring and the third wiring are different, thus the current flowing through one pixel circuit and the current flowing through the second pixel circuit are different. Therefore, among the first wiring and the second wiring, the wiring through which the greater current flows can be thicker than the other wiring.

In the electro-optical device described above, it is preferable that the first wiring, the second wiring, and the third wiring are arranged in a display region in which the first pixel circuit and the second pixel circuit are arranged and at an outside of the display region, and at least a part of the first wiring and at least a part of the second wiring are thinner than the third wiring at the outside of the display region.

According to this configuration, the current flowing through the first wiring electrically connected to the first pixel circuit and the current flowing through the second wiring electrically connected to the second pixel circuit are smaller than the current flowing in the third wiring which is electrically connected to both the first pixel circuit and the second pixel circuit. Therefore, at least a part of the first wiring and at least a part of the second wiring can be thinner than the third wiring. In other words, by making the third wiring thicker than at least a part of the first wiring and at least a part of the second wiring, a current greater than that of the first wiring and the second wiring can flow through the third wiring.

In the electro-optical device described above, it is preferable that the electro-optical device further includes a fourth wiring for supplying a fourth potential to the first pixel circuit and the second pixel circuit, wherein the third potential and the fourth potential are mutually independent.

According to this configuration, a voltage applied to the first pixel circuit and a voltage applied to the second pixel circuit can be set with the fourth potential supplied to the first pixel circuit and the second pixel circuit as a common potential. Therefore, the power supply voltage can be supplied to the first pixel circuit and the second pixel circuit from the power supply system having the fourth potential as the common potential independently from the power supply system having the third potential as the common potential.

In the electro-optical device described above, it is preferable that the third potential and the fourth potential are different from each other.

According to this configuration, different power supply voltages can be supplied to the first pixel circuit and the second pixel circuit from the power supply system having the third potential as the common potential and the power supply system having the fourth potential as the common potential.

In the electro-optical device described above, it is preferable that another terminal of the first light-emitting element is electrically connected to the fourth wiring, and another terminal of the second light-emitting element is electrically connected to the fourth wiring.

According to this configuration, the first light-emitting element is arranged between the first wiring and the fourth wiring, and the second light-emitting element is arranged between the second wiring and the fourth wiring. In contrast, the first memory circuit is arranged between the first wiring and the third wiring, and the second memory circuit is arranged between the second wiring and the third wiring, so that the first light-emitting element and the second light-emitting element can be caused to emit light by a power supply system having the fourth potential as the common potential, and the first memory circuit and the second memory circuit can be operated with a power supply system having the third potential as the common potential. Thus, it is capable to miniaturize the transistors constituting the first memory circuit and the second memory circuit to operate at high speed and to cause the first light-emitting element and the second light-emitting element to emit light with high luminance.

In the electro-optical device described above, it is preferable that the first wiring, the second wiring and the fourth wiring are arranged in a display region in which the first pixel circuit and the second pixel circuit are arranged and at an outside of the display region, and at least a part of the first wiring and at least a part of the second wiring are thinner than the fourth wiring at the outside of the display region.

According to this configuration, the current flowing through the first wiring electrically connected to the first pixel circuit and the current flowing through the second wiring electrically connected to the second pixel circuit are smaller than the current flowing through the fourth wiring which is electrically connected to both the first pixel circuit and the second pixel circuit. Therefore, at least a part of the first wiring and at least a part of the second wiring can be thinner than the fourth wiring. In other words, by making the fourth wiring thicker than at least a part of the first wiring and at least a part of the second wiring, a current greater than that of the first wiring and the second wiring can flow through the fourth wiring.

An electronic apparatus according to the present disclosure includes the electro-optical device described above.

According to this configuration, a high-quality image can be displayed on the electronic apparatus such as a head-mounted display, and the like.

The entire disclosure of Japanese Patent Applications No. 2018-027635, filed Feb. 20, 2018 and No. 2019-004135, filed Jan. 15, 2019 are expressly incorporated by reference herein.

What is claimed is:

1. An electro-optical device comprising:
    a first data line;
    a second data line;
    a scan line;
    a first pixel circuit being provided in correspondence with an intersection of the first data line and the scan line, the first pixel circuit including a first light-emitting element, a first enable transistor and a first drive transistor;
    a second pixel circuit being provided in correspondence with an intersection of the second data line and the scan line, the second pixel circuit including a second light-emitting element, a second enable transistor and a second drive transistor;
    a first potential line supplying a first potential to the first pixel circuit;
    a second potential line supplying a second potential to the second pixel circuit;
    a third potential line supplying a third potential to the first pixel circuit and the second pixel circuit; and
    a fourth potential line supplying a fourth potential to the first pixel circuit and the second pixel circuit, wherein
    the first light-emitting element, the first enable transistor and the first drive transistor are disposed in series between the first potential line and the fourth potential line,
    the second light-emitting element, the second enable transistor and the second drive transistor are disposed in series between the second potential line and the fourth potential line, and
    the first enable transistor and the second enable transistor turn ON simultaneously.

2. The electro-optical device according to claim 1, wherein
    the first enable transistor and the second enable transistor are P-type, and
    the third potential is lower than the first potential and the second potential, and higher than the fourth potential.

3. The electro-optical device according to claim 1, wherein
    the first enable transistor and the second enable transistor are N-type, and
    the third potential is higher than the first potential and the second potential, and lower than the fourth potential.

4. The electro-optical device according to claim 1, wherein
    the first enable transistor and the second enable transistor turn OFF simultaneously.

5. The electro-optical device according to claim 1, wherein
    the first light-emitting element emits a first light, and
    the second light-emitting element emits a second light of which color is different from the first light.

6. An electronic apparatus comprising the electro-optical device according to claim 1.

7. The electro-optical device according to claim 1, wherein
    the first pixel circuit includes a first transistor that controls electrical connection between the first drive transistor and the first data line according to a scanning signal being supplied via a scan line of the first pixel circuit,
    the second pixel circuit includes a second transistor that controls electrical connection between the second drive transistor and the second data line according to the scanning signal, and
    the third potential line is electrically connected to the first transistor and the second transistor.

8. An electro-optical device comprising:
    a plurality of data lines;
    a plurality of scan lines;
    a plurality of enable lines;
    a plurality of pixel circuits arranged in a display region, each of the pixel circuits being provided corresponding to intersection of each of the data lines and each of the scan lines respectively;
    a first potential line supplying a first potential to the plurality of pixel circuits;
    a second potential line supplying a second potential to the plurality of pixel circuits;
    a third potential line supplying a third potential to the plurality of pixel circuits;
    a fourth potential line supplying a fourth potential to the plurality of pixel circuits; and
    each of the plurality of pixel circuits including a light emitting element, an enable transistor, and a drive transistor disposed in series between a first potential line and the fourth potential line, wherein
    each of the plurality of enable lines supplies an enable signal to turn ON each enable transistor simultaneously during a part of a period that all of the plurality of scan lines do not supply a scanning signal.

9. The electro-optical device according to claim 8, wherein
    each of the pixel circuits comprises:
        a first pixel circuit; and
        a second pixel circuit,
    the first potential is supplied to the first pixel circuit,
    the second potential is supplied to the second pixel circuit,
    the third potential is supplied to the first pixel circuit and the second pixel circuit,
    the fourth potential is supplied to the first pixel circuit and the second pixel circuit,
    the first pixel circuit corresponds to a first color and includes a first light-emitting element,
    the second pixel circuit corresponds to a second color that differs from the first color, and includes a second light-emitting element,
    the first potential is different from the second potential,
    the first potential and the second potential are mutually independent,
    the third potential is higher than the first potential and the second potential, and
    the fourth potential is higher than the third potential, and lower than the first potential and the second potential.

10. The electro-optical device according to claim 9, wherein
    the first pixel circuit includes a first drive transistor that is electrically connected in series to the first light-emitting element between the first potential and the third potential, and the second pixel circuit includes a second drive transistor that is electrically connected in series to the second light-emitting element between the second potential and the third potential.

11. The electro-optical device according to claim 10, wherein the plurality of data lines comprises:
a first data line; and
a second data line,
the first pixel circuit includes a first transistor that controls electrical connection between the first drive transistor and the first data line according to a scanning signal being supplied via a scan line of the first pixel circuit,
the second pixel circuit includes a second transistor that controls electrical connection between the second drive transistor and the second data line according to the scanning signal, and
the third potential line is electrically connected to the first transistor and the second transistor.

12. An electronic apparatus comprising the electro-optical device according to claim 8.

* * * * *